(12) United States Patent
Nemoto

(10) Patent No.: US 6,358,764 B1
(45) Date of Patent: Mar. 19, 2002

(54) SEMICONDUCTOR LIGHT EMITTING DEVICE AND METHOD OF PRODUCING SAME

(75) Inventor: Kazuhiko Nemoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/614,544

(22) Filed: Jul. 12, 2000

Related U.S. Application Data

(62) Division of application No. 09/465,341, filed on Dec. 17, 1999.

(51) Int. Cl.[7] .............................................. H01L 21/00
(52) U.S. Cl. ............................ 438/22; 438/38; 438/41; 438/46
(58) Field of Search ........................... 438/22, 38, 41, 438/46, 39, 44

(56) References Cited

U.S. PATENT DOCUMENTS 5,998,231 A * 12/1999 Yamamoto

* cited by examiner

Primary Examiner—Kevin M. Picardat
Assistant Examiner—D. M. Collins
(74) Attorney, Agent, or Firm—Sonnenschein, Nath & Rosenthal

(57) ABSTRACT

A semiconductor light emitting device having a plurality of semiconductor light emitting elements of different emission wavelengths capable of reducing the number of parts and simplifying the configuration of an optical system, comprising a substrate and at least two stacks each comprised of an epitaxial growth layer comprised of at least a first conductivity type clad layer, an active layer, and a second conductivity type clad layer on the substrate, the stacks being spatially separated, the compositions of at least the active layers being different between the stacks, and a plurality of types of light having mutually different wavelengths being emitted from the active layers in parallel with the substrate and in substantially the same direction, and a method for producing the same.

9 Claims, 26 Drawing Sheets

SEMICONDUCTOR LIGHT EMITTING DEVICE AND METHOD OF PRODUCING SAME

This application is a division of Ser. No. 09/465,341 filed Dec. 17, 1999.

BACKGROUND OF THE INVENTION

1. Field of the Invention

The present invention relates to a semiconductor light emitting device and a method of producing the same, more particularly relates to a semiconductor light emitting device having a plurality of semiconductor light emitting elements for emitting a plurality of types of light having different wavelengths and a method of producing the same.

2. Description of the Related Art

An optical pickup is generally built into apparatuses for reading (reproducing) information recorded on a Compact Disk (CD), a Digital Video Disk (DVD), a Mini Disk (MD), or other optical recording medium optically recording information (hereinafter also referred to as an optical disk) or for writing (recording) information on the same (hereinafter also referred to as optical disk apparatuses).

In the above optical disk apparatuses and optical pickups, different wavelengths of laser light are generally used in different kinds of optical disks (optical disk systems). Laser light having a wavelength of 780 nm is used for playing a CD, while laser light having a wavelength of 650 nm is used for playing a DVD.

Under these conditions, where different wavelengths of laser light are used depending on the kinds of the optical disks, a compatible optical pickup which enables, for example, a CD to be played in a DVD optical disk apparatus has been desired.

FIG. 1 is a view of the configuration of a compatible optical pickup provided with a CD laser diode LD1 (emission wavelength of 780 nm) and a DVD laser diode LD2 (emission wavelength of 650 nm) so as to enable playback of a CD and DVD as a first example of the related art.

An optical pickup 100 includes a separately configured, that is, discretely composed CD optical system comprised of, for example, a first laser diode LD1 for emitting laser light having a wavelength of for example the 780 nm band, a grating G, a first beam splitter BS1, a first mirror M1, a first object lens OL1, a first multiple lens ML1, and a first photodiode PD1, arranged at predetermined positions.

Furthermore, the above optical pickup 100 includes a DVD optical system comprising, for example, a second laser diode LD2 for emitting laser light having a wavelength of for example the 650 nm band, a second beam splitter BS2, a collimeter C, a second mirror M2, a second object lens OL2, a second multiple lens ML2, and a second photodiode PD2 arranged at predetermined positions.

In the CD optical system of the optical pickup 100 of the above configuration, the first laser light L1 from the first laser diode LD1 passes through the grating G, is partially reflected by the first beam splitter BS1, is bent in course by the first mirror M1, and then is converged on an optical disk D by the first object lens OL1.

The reflected light from the optical disk D passes through the first multiple lens ML1 via the first object lens OL1, the first mirror M1, and the first beam splitter BS1 and strikes the first photodiode PD1. The information recorded on the CD recording surface of the optical disk D is read by the changes of this reflected light.

In the DVD optical system of the optical pickup 100 of the above configuration as well, in the same way as the above, the laser light L2 from the second laser diode LD2 is partially reflected by the second beam splitter BS2, passes through the collimeter C, is bent in its course by the second mirror M2, and then is converged on the optical disk D by the second object lens OL2.

The reflected light from the optical disk D passes through the second multiple lens ML2 via the second object lens OL2, second mirror M2, collimeter C, and second beam splitter BS2 and strikes the second photodiode PD2. The information recorded on the DVD recording surface of the optical disk D is read by the changes of this reflected light.

The above optical pickup 100 makes it possible to play back both CD and DVD by providing a CD laser diode, a DVD laser diode, and respective optical systems.

FIG. 2 is a view of the configuration of a compatible optical pickup provided with a CD laser diode LD1 (emission wavelength of 780 nm) as in the above and a DVD laser diode LD2 (emission wavelength of 650 nm) so as enable playback of a CD and DVD as a second example of the related art.

An optical pickup 101 contains a separately configured, that is, discretely composed CD optical system comprising, for example, a first laser diode LD1 for emitting laser light having a wavelength of for example the 780 nm band, a grating G, a first beam splitter BS1, a dichroic beam splitter DBS, a collimeter C, a mirror M, a CD aperture R, an object lens OL, a first multiple lens ML1, and a first photodiode PD1, arranged at predetermined positions.

Furthermore, the above optical pickup 101 contains a DVD optical system comprising, for example, a second laser diode LD2 for emitting laser light having a wavelength of for example the 650 nm band, a second beam splitter BS2, the dichroic beam splitter DBS, the collimeter C, the mirror M, the object lens OL, a second multiple lens ML2, and a second photodiode PD2 arranged at predetermined positions.

In the above optical systems, some of the optical members are used in common, for example, the dichroic beam splitter DBS, the collimeter C, the mirror M, and the object lens OL are commonly used by the two optical systems. Since the dichroic beam splitter DBS and the optical disk D share the same optical axis, a CD aperture R is provided on the optical axis of the DVD optical system as well.

In the CD optical system of the optical pickup 101 of the above configuration, the first laser light L1 from the first laser diode LD1 passes through the grating G, is partially reflected by the first beam splitter BS1, passes through or is reflected at the dichroic beam splitter DBS, the collimeter C, and the mirror M, and then is converged on the optical disk D by the object lens OL via the CD aperture R.

The reflected light from the optical disk D passes through the first multiple lens ML1 via the object lens OL, the CD aperture R, the mirror M, the collimeter C, the dichroic beam splitter DBS, and the first beam splitter BS1 and strikes the first photodiode PD1. The information recorded on the CD recording surface of the optical disk D is read by the change of this reflected light.

In the DVD optical system of the optical pickup 101 of the above configuration as well, in the same way as the above, the laser light L2 from the second laser diode LD2 is partially reflected by the second beam splitter BS2, passes through or is reflected at the dichroic beam splitter DBS, the collimeter C, and the mirror M, and then is converged on the optical disk D by the object lens OL via the CD aperture R.

The reflected light from the optical disk D passes through the second multiple lens ML2 via the object lens OL, the CD aperture R, the mirror M, the collimeter C, the dichroic beam splitter DBS, and the second beam splitter BS2 and strikes the second photodiode PD2. The information recorded on the DVD recording surface of the optical disk D is read by the changes in this reflected light.

According to the above optical pickup 101, in the same way as in the optical pickup 100 shown in FIG. 1, it is made possible to play back both CD and DVD by providing a CD laser diode and a DVD laser diode and respective optical systems.

Summarizing the problems to be solved by the present invention, the above optical pickups have a large number of parts and the optical systems are complicated in configuration, so it is not easy to assemble the pickups, it is difficult to make the optical device compact, and, furthermore, the cost inevitably becomes higher.

In the above optical pickups of the related art, one of the reasons why the number of parts was large and the optical system became complex in configuration was that the CD laser diode and the DVD laser diode were separately provided.

An example of a laser diode used in the above optical pick up system is shown in FIG. 3 by a cross-sectional view.

For example, an n-type GaAs buffer layer 31, an n-type AlGaAs clad layer 32, an active layer 33, a p-type AlGaAs clad layer 34, and a p-type GaAs cap layer 35 are stacked on an n-type GaAs substrate 30. A stripe forming a current narrowing structure is formed as an insulated region 41 from the surface of the p-type GaAs cap layer 35 to the middle of the p-type AlGaAs clad layer 34.

Also, a p-type electrode 42 is formed connected to the p-type GaAs cap layer 35 and an n-type electrode 43 is formed connected to the n-type GaAs substrate 30.

In a laser diode of the above configuration, one laser structure is formed by stacking, for example, an AlGaInP-based material on a GaAs substrate, or one laser structure is formed by stacking an InGaAsP-based material on an InP substrate. That is, a laser structure is formed by one kind of material on one kind of substrate, and light of a substantially constant single type of wavelength is emitted.

Also, as shown in FIG. 4, there has been developed a method of forming a first laser diode LD1 and a second laser diode LD2 on the same substrate in accordance with usage.

For example, an n-type GaAs buffer layer 31, an n-type AlGaAs clad layer 32, an active layer 33, a p-type AlGaAs clad layer 34, and a p-type GaAs cap layer 35 are stacked on an n-type GaAs substrate 30. A first laser diode LD1 is formed by forming a stripe forming a current narrowing structure by an insulated region 41 from the surface of the p-type GaAs cap layer 35 to the middle of the p-type AlGaAs clad layer 34.

On the other hand, the second laser diode LD2 has substantially the same configuration. The composition of an active layer 33' is basically the same as that of the active layer 33 of the first laser diode LD1, so the wavelengths of laser light emitted are almost the same (if not, the difference is very small).

Furthermore, a p-type electrode 42 is formed connected to the p-type GaAs cap layer 35, and an n-type electrode 43 is formed connected to the n-type GaAs substrate 30.

However, in the first laser diode LD1 and the second laser diode LD2 of the above configuration, the wavelengths of the light emitted from the two laser diodes are the same or, even if not the same, the difference is very small. Therefore, they cannot be used, for example, for a CD laser diode and a DVD laser diode.

SUMMARY OF THE INVENTION

An object of the present invention is to provide a semiconductor light emitting device having a plurality of semiconductor light emitting elements of different emission wavelengths enabling an optical pickup of a CD, DVD, or other different wavelength optical disk system to be reduced in the number of parts, simplified in the configuration of the optical system, easily assembled, and made more compact and lower in cost.

To attain the above object, according to a first aspect of the present invention, there is provided a semiconductor light emitting device having a plurality of semiconductor light emitting elements on a substrate, comprising a substrate and at least two stacks each formed on the substrate and comprised of an epitaxially grown layer comprising at least a first conductivity type clad layer, an active layer, and a second conductivity type clad layer stacked together; the stacks being spatially separated from each other; the composition of at least the active layers being different between the stacks; and a plurality of types of light of different wavelengths from each other being emitted from the active layers to a direction parallel to a surface of the substrate.

Since the above semiconductor light emitting device of the present invention provides on a substrate at least two stacks comprised of epitaxial growth layers each comprising at least a first conductivity type clad layer, an active layer, and a second conductivity type clad layer and the compositions of the active layers differ between the stacks, it is possible to construct a monolithic semiconductor light emitting device capable of emitting a plurality of types of light having different wavelengths from the active layers.

The semiconductor light emitting device of the present invention preferably emits a plurality of types of laser light having respectively different wavelengths from the active layers. By this, it is possible to provide a laser diode enabling an optical pickup of a CD, DVD, or other different wavelength optical disk system to be reduced in number of parts, simplified in configuration, easily assembled, and made compact and lower in cost.

The semiconductor light emitting device preferably is one in which the ratios of composition of the active layers are different between the stacks. Alternatively, it is one in which the compositions of the active layers include different elements between the stacks. Alternatively, it is one in which the compositions of the first conductivity type clad layers, the active layers, and the second conductivity type clad layers are different between the stacks. It therefore becomes possible to make the wavelengths of the light emitted from the active layers different.

The semiconductor light emitting device preferably is one wherein types of light of different polarization directions are emitted from the active layers. Since provision is made on a substrate of at least two stacks each comprising a first conductivity type clad layer, an active layer, and a second conductive clad layer, it is possible to configure semiconductor light emitting elements to emit light of different polarization directions on the same substrate.

The semiconductor light emitting device is preferably one comprising, as the stacks, a first stack and a second stack, the first stack and second stack being formed above the substrate. More preferably, the substrate is a first conductivity type; and the first stack and second stack are formed stacked above the substrate from a side of the first conductivity type clad layers and electrically connected using the substrate as a common electrode. It therefore becomes possible to provide a plurality of stacks directly above the substrate.

Alternatively, the semiconductor light emitting device is preferably one comprising, as the stacks, a first stack and a second stack; the second stack being formed above the first stack. More preferably, the substrate is a first conductivity type; and the second stack is formed stacked above the first stack in a region made the first conductivity type from a side of the first conductivity type clad layer and is formed electrically connected to the substrate via the first stack in the region made the first conductivity type. Alternatively, more preferably, the substrate is a first conductivity type; and the second stack is formed above the first stack via a first conductivity type layer formed above a second conductivity type layer of the first stack. It therefore becomes possible to provide a further stack above a stack formed on the substrate.

The semiconductor light emitting device preferably is one wherein each of the stacks has a current narrowing structure. More preferably, a region doped with an impurity is formed in the stack to form the current narrowing structure. Alternatively, more preferably, the stack is processed to a ridge shape to form the current narrowing structure. It therefore is possible to improve the efficiency of current injection for more effective operation and to reduce the power consumption.

Further, to attain the above object, according to a second aspect of the present invention, there is provided a method of producing a semiconductor light emitting device comprising on a substrate a first semiconductor light emitting element and a second semiconductor light emitting element for emitting light of different wavelengths from each other, including the steps of forming on the substrate by an epitaxial growth method a first stack comprised of at least a first clad layer of a first conductivity type, a first active layer, and a second clad layer of a second conductivity type; removing the parts of the first stack other than the part at the first semiconductor light emitting element formation region; forming on the substrate by an epitaxial growing method a second stack comprised of at least a third clad layer of the first conductivity type, a second active layer, and a fourth clad layer of the second conductivity type; and removing the parts of the second stack other than the part at the second semiconductor light emitting element formation region; at least the first active layer and the second active layer being formed by different compositions from each other.

In the method of producing the semiconductor light emitting device of the present invention, that is, an epitaxial growth method is used to form on a substrate a first stack comprising at least a first clad layer of a first conductivity type, a first active layer, and a second clad layer of a second conductivity type. Next, the parts of the first stack other than the part of the first stack at a first semiconductor light emitting element formation region are removed. Next, an epitaxial growth method is used to form on the substrate a second stack comprising at least a third clad layer of the first conductivity type, second active layer, and a fourth clad layer of the second conductivity type. Here, the first active layer and second active layer are formed by different compositions from each other. Next, the parts of the second stack other than the part of the second stack at a second semiconductor light emitting element formation region are removed.

According to the above method of producing the semiconductor light emitting device of the present invention, it is possible to directly form above the substrate a first stack comprising a first clad layer of a first conductivity type, a first active layer, and a second clad layer of a second conductivity type and a second stack comprising a third clad layer of the first conductivity type, a second active layer, and a fourth clad layer of the second conductivity type.

Since the compositions of the two active layers are made different between the stacks, it is possible to form a monolithic semiconductor light emitting device capable of emitting light of different wavelengths from the active layers. Therefore, the invention is suitable for the optical pickup of CD, DVD, or other different wavelength optical disk systems and also enables the number of parts to be reduced, the configuration of the optical system to be simplified, assembly to be made easy, and greater compactness and lower cost to be achieved.

Also, to attain the above object, according to a third aspect of the present invention, there is provided a method of producing a semiconductor light emitting device having on a substrate a first semiconductor light emitting element and a second semiconductor light emitting element for emitting light of different wavelengths from each other, including the steps of forming on a substrate by an epitaxial growth method a first stack comprising at least a first clad layer of a first conductivity type, a first active layer, and a second clad layer of a second conductivity type; forming on the first stack by an epitaxial growth method a second stack comprising at least a third clad layer of the first conductivity type, a second active layer, and a fourth clad layer of the second conductivity type; and removing the parts of the first stack and second stack other than the parts of the first stack and second stack at a second semiconductor light emitting element formation region and the part of the first stack at a first semiconductor light emitting element formation region; at least the first active layer and second active layer being formed by different compositions from each other.

In the above method of producing a semiconductor light emitting device of the present invention, an epitaxial growth method is used to form on a substrate a first stack comprising at least a first clad layer of a first conductivity type, first active layer, and a second clad layer of a second conductivity type. Next, an epitaxial growth method is used to form on the first stack a second stack comprising at least a third clad layer of the first conductivity type, a second active layer, and a fourth clad layer of the second conductivity type. Here, compositions of at least the first active layer and the second active layer are made different. Then, the parts of the first stack and the second stack other than the parts of the second stack and first stack at a second semiconductor light emitting element formation region and the part of the first stack at a first semiconductor light emitting element formation region are removed.

According to the above method of producing a semiconductor light emitting device of the present invention, it is possible to provide on a first stack comprising a first clad later of a first conductivity type, first active layer, and second clad layer of a second conductivity type formed on a substrate a second stack comprising a third clad layer of the first conductivity type, a second active layer, and a fourth clad layer of the second conductivity type. In such a case, since the second stack can be formed on a flat surface (on upper surface of the first stack), the epitaxial growth becomes easy.

Since the compositions of the two active layers are made different between the stacks, it is possible to form a monolithic semiconductor light emitting device capable of emitting light of different wavelengths from the active layers. Therefore, the invention is suitable for an optical pickup of a CD, DVD, or other different wavelength optical disk system and provides a laser diode which enables the number of parts to be reduced, the configuration of the optical system to be simplified, assembly to be made easy, and greater compactness and lower cost to be achieved.

The method of producing the semiconductor light emitting device of the present invention preferably is one further including the step of making the first stack at the second semiconductor light emitting element formation region a first conductivity type prior to the step of forming the second stack; and in the step of forming the second stack, forming the second stack above the first stack made the first conductivity type from a side of the third clad layer of the first conductivity type of the second stack.

It is therefore possible to form the second stack so as to be connected to the substrate via the first stack made the first conductivity type.

The above methods of producing the semiconductor light emitting device of the present invention preferably are ones wherein the first active layer and second active layer are formed to have mutually different ratios of composition. Alternately, they are ones wherein the first active layer and second active layer are formed by mutually different composition elements. Alternately, they are ones wherein the compositions of the first clad layer of the first conductivity type, first active layer, and second clad layer of the second conductivity type and the compositions of the third clad layer of the first conductivity type, second active layer, and fourth clad layer of the second conductivity type are made different from each other. As a result, it is possible to make the wavelengths of light emitted from the active layers mutually different.

BRIEF DESCRIPTION OF THE DRAWINGS

These and other objects and features of the present invention will become clearer from the following description of the preferred embodiments given with reference to the accompanying drawings, in which:

FIGS. 11A and 11B are sectional views of steps in a method of producing a laser diode according to the first embodiment, wherein FIG. 11A is a view of the state up to a step of forming a stack forming a first laser diode and FIG. 11B is a view of the state up to a step of etching away the stack while leaving a first laser diode region;

FIGS. 12A and 12B are views of steps after FIG. 11B, wherein FIG. 12A is a view of the state up to a step of forming a stack for forming a second laser diode and FIG. 12B is a view of the state up to a step of etching away the stack while leaving a second laser diode region;

FIGS. 13A and 13B are views of steps after FIG. 12B, wherein FIG. 13A is a view of the state up to a step of forming a stripe for forming a current narrowing structure and FIG. 13B is a view of the state up to a step of forming n-type and p-type electrodes;

FIGS. 15A and 15B are sectional views of steps of a method of producing a laser diode according to the second embodiment of the present invention, wherein FIG. 15A is a view of the state up to a step of etching away the second laser diode region and FIG. 15B is a view of the state up to a step of forming a ridge structure for forming a current narrowing structure;

FIGS. 16a and 16B are views of steps after FIG. 15B, wherein FIG. 16A is a view of the state up to a step of forming an insulating film and FIG. 16B is a view of the state up to a step of forming n-type and p-type electrodes;

FIGS. 18A and 18B are sectional views of steps of a method of producing a laser diode according to the third embodiment, wherein FIG. 18A is a view of the state up to a step of etching while leaving a second laser diode region and FIG. 18B is a view of the state up to a step of forming a ridge structure for forming a current narrowing structure;

FIGS. 19A and 19B are views of steps after FIG. 18B, wherein FIG. 19A is a view of the state up to a step of burying a part etched to a ridge shape by GaAs and FIG. 19B is a view of the state up to a step of removing the insulating film;

FIGS. 20A and 20B are views of steps after FIG. 19B, wherein FIG. 20A is a view of the state up to a step of removing the GaAs while leaving the part etched to a ridge shape and FIG. 20B is a view of the state up to a step of forming n-type and p-type electrodes;

FIGS. 21A and 21B are views of other steps in the method of a laser diode according to the third embodiment, wherein FIG. 21A is a view of the state up to a step of burying the part etched to a ridge shape by GaAs and FIG. 21B is a view of the state up to a step of removing the GaAs while leaving the part etched to a ridge shape;

FIGS. 23A and 23B are sectional views of steps of a method of producing a laser diode according to a fourth embodiment of the present invention, wherein FIG. 23A is a view of the state up to a step of forming a p-type cap layer for a first laser diode and FIG. 23B is a view of the state up to a step of making the second laser diode formation region an n-type;

FIGS. 24A and 24B are view of steps after FIG. 23B, wherein FIG. 24A is a view of the state up to a step of forming a p-type cap layer for a second laser diode and FIG.

Figure 24A:
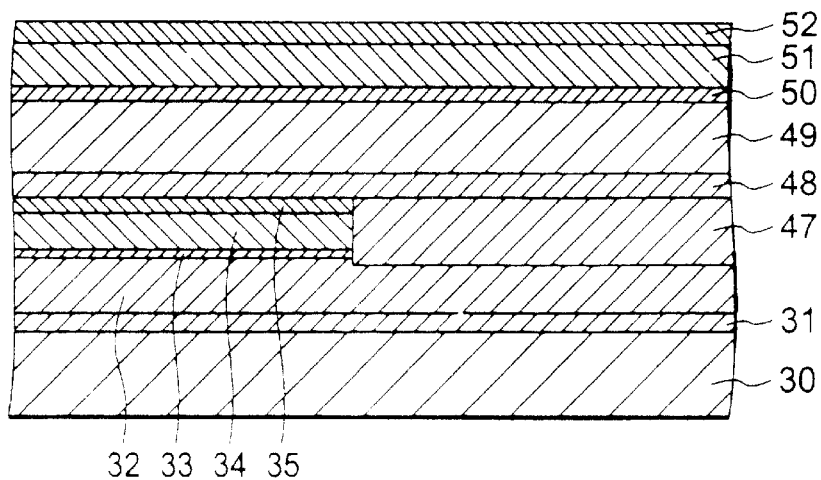
Figure 24B:
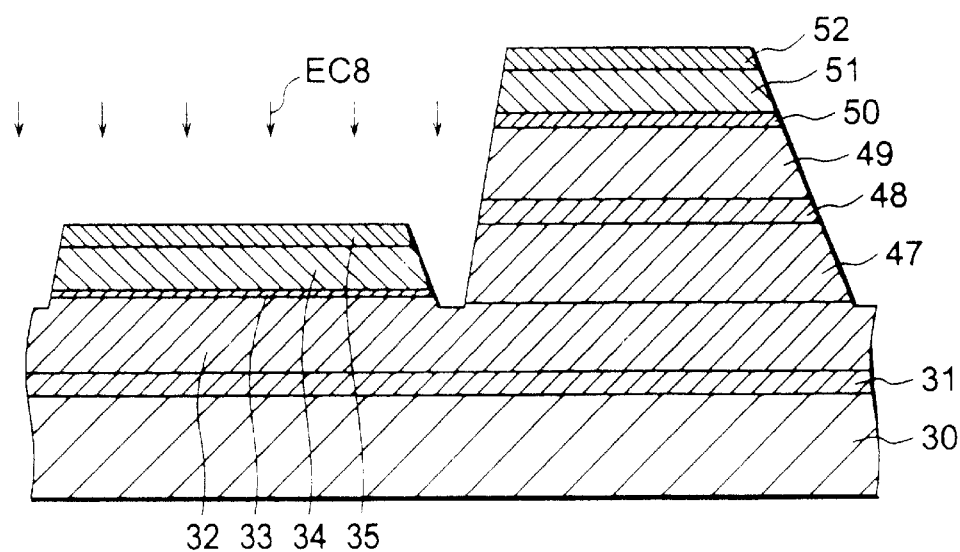
Figure 25A:
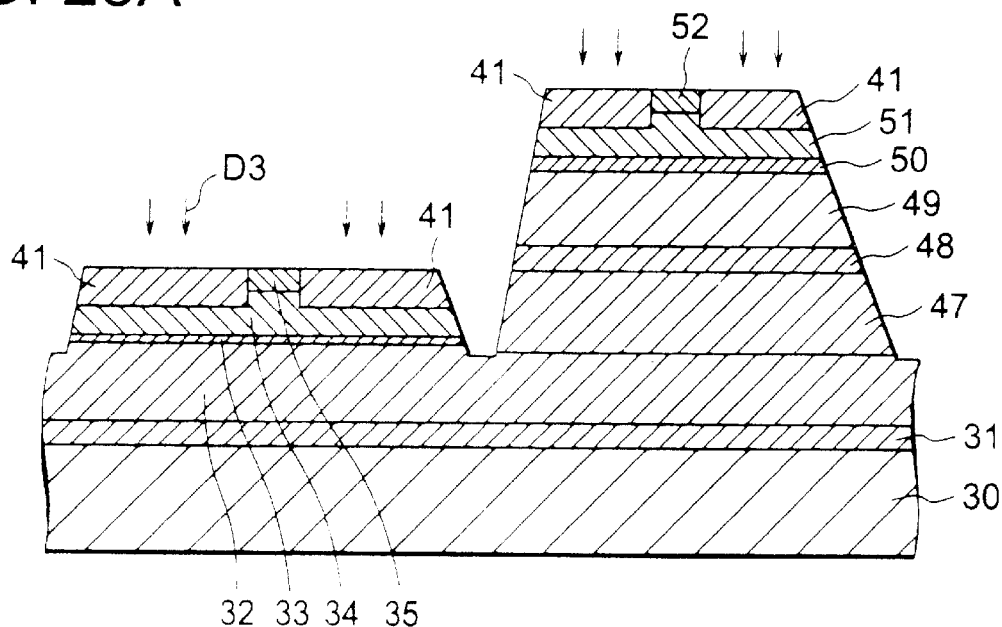
Figure 25B:
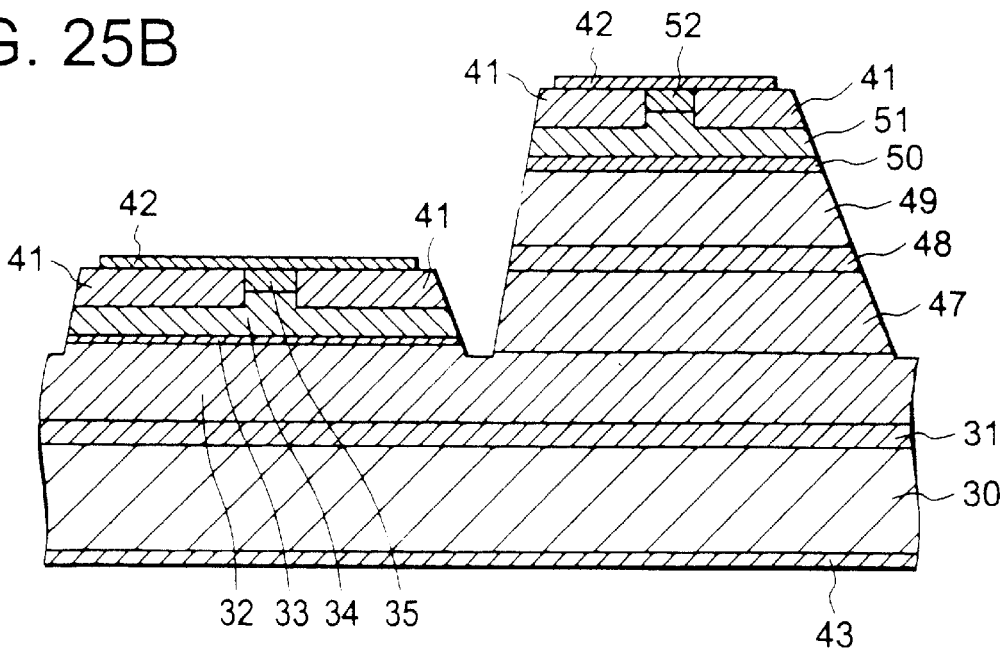
Figure 26:
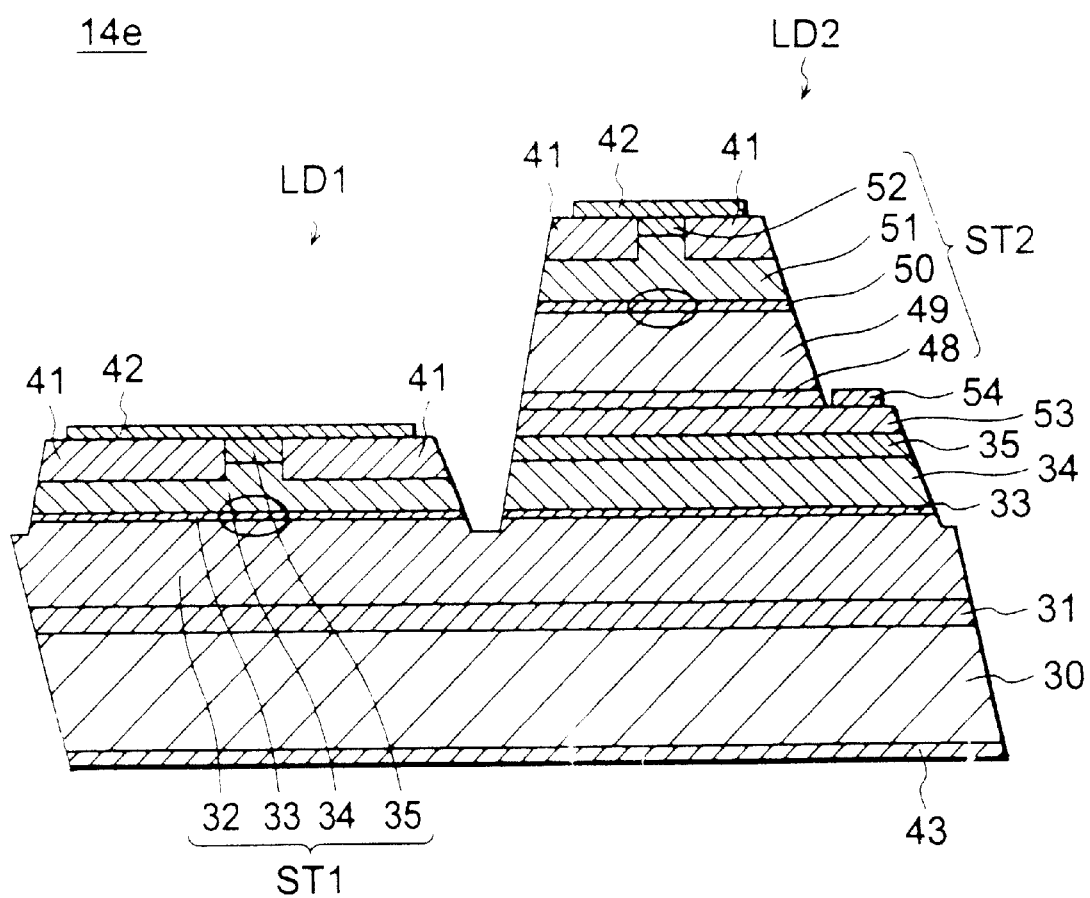
Figure 27A:
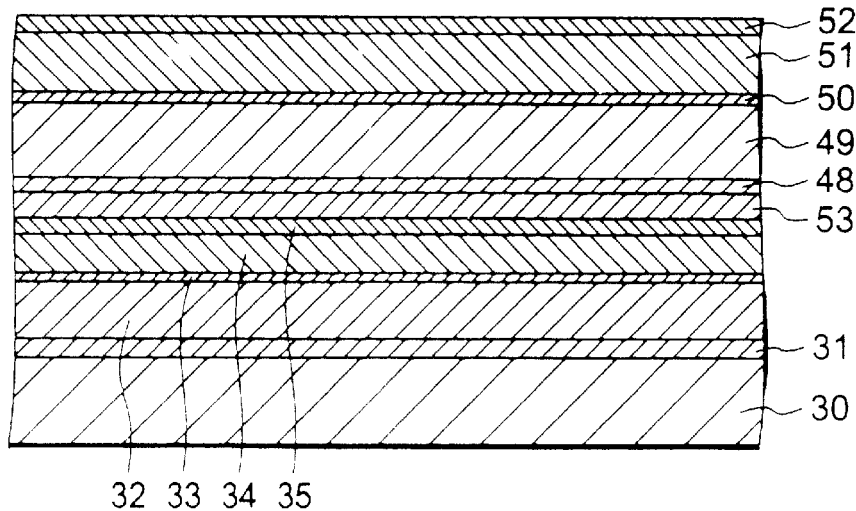
Figure 27B:
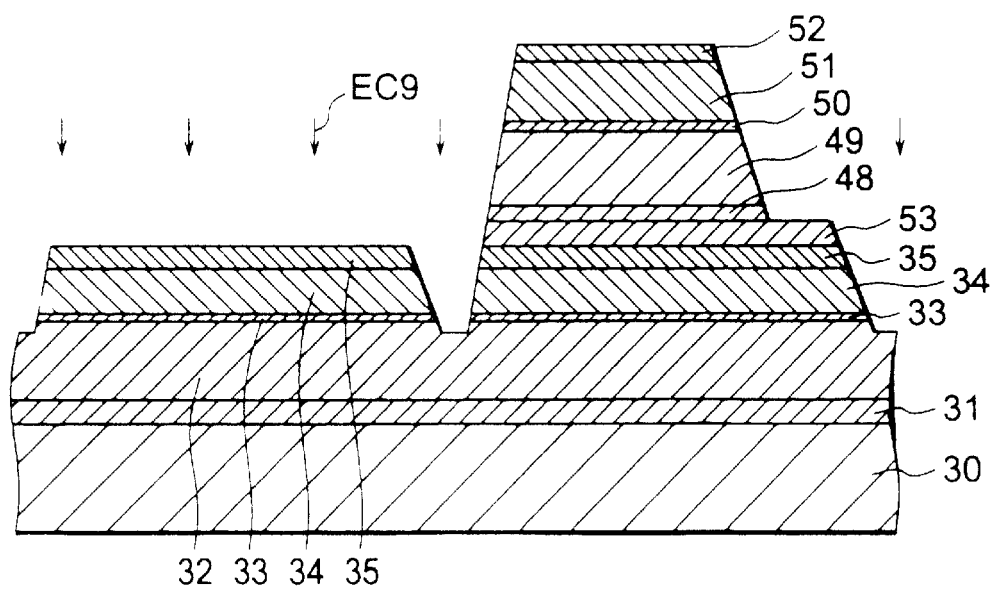
Figure 28A:
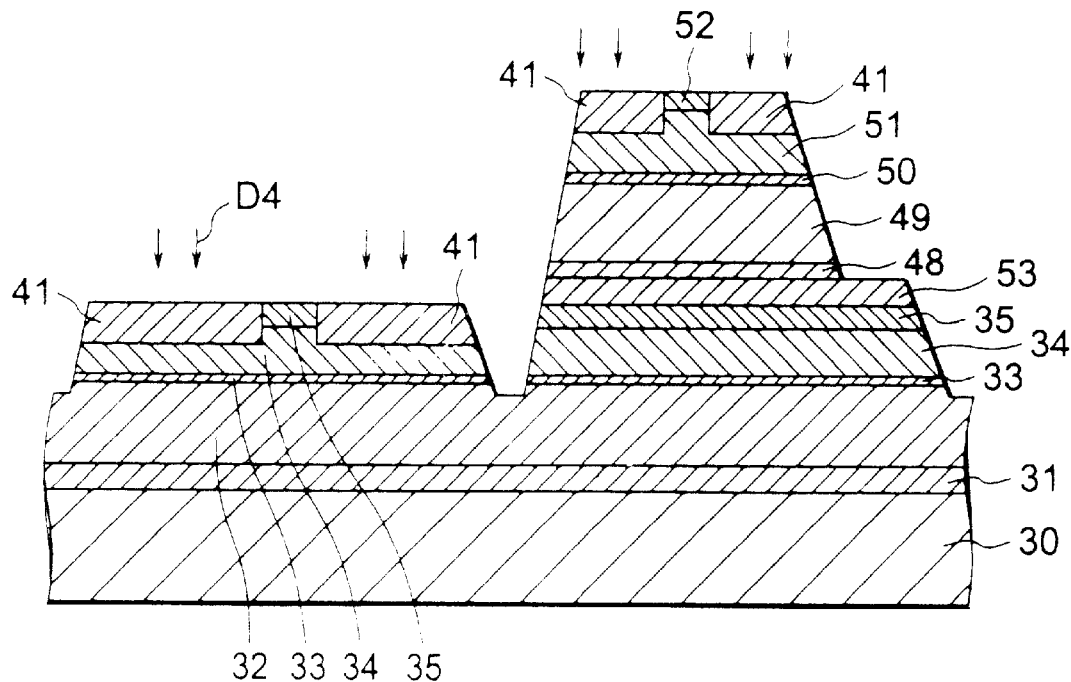
Figure 28B:
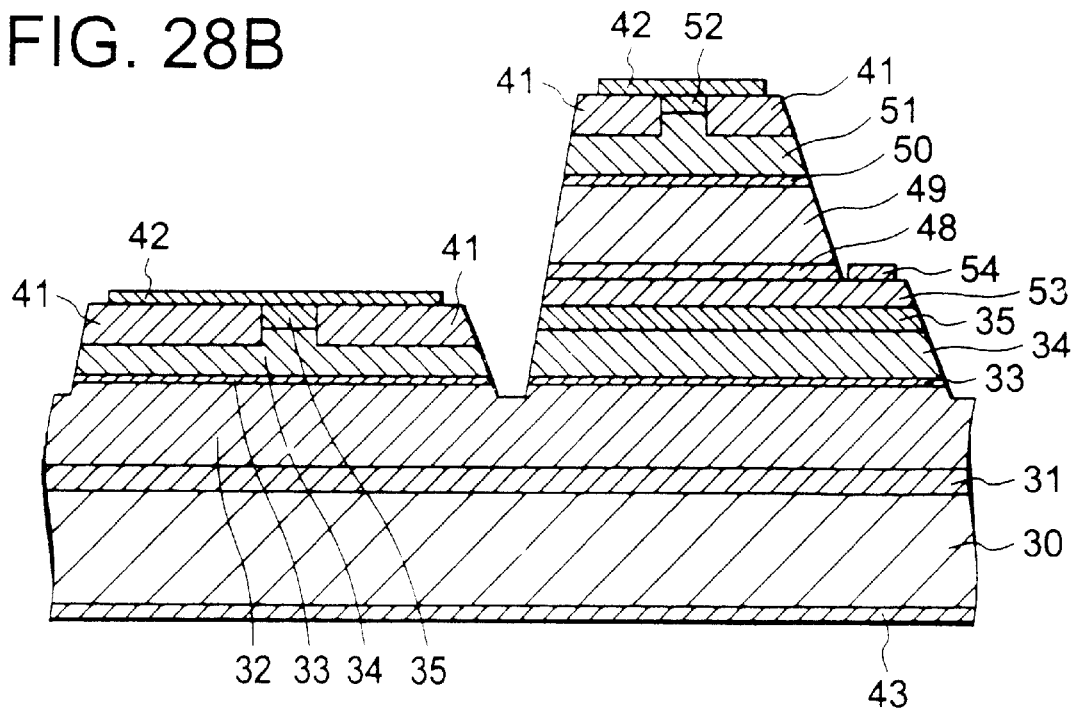

24B is a view of the state up to a step of etching while leaving layers for forming a first diode and second diode;

FIGS. 25A and 25B are views of steps after FIG. 24B, wherein FIG. 25A is a view of the state up to a step of forming a stripe for forming a current narrowing structure and FIG. 25B is a view of the state up to a step of forming n-type and p-type electrodes;

FIG. 26 is a sectional view of a laser diode according to a fifth embodiment of the present invention;

FIGS. 27A and 27B are sectional views of steps of a method of producing a laser diode according to the fifth embodiment, wherein FIG. 27A is a view of the state up to a step of forming a p-type cap layer for a second laser diode and FIG. 27B is a view of the state up to a step of etching while leaving layers for forming a first laser diode and second laser diode; and FIGS. 28A and 28B are views of steps after FIG. 27B, wherein FIG. 28A is a view of the state up to a step of forming a stripe for forming a current narrowing structure and FIG. 28B is a view of the state up to a step of forming n-type and p-type electrodes.

DESCRIPTION OF THE PREFERRED EMBODIMENTS

Figure 1:
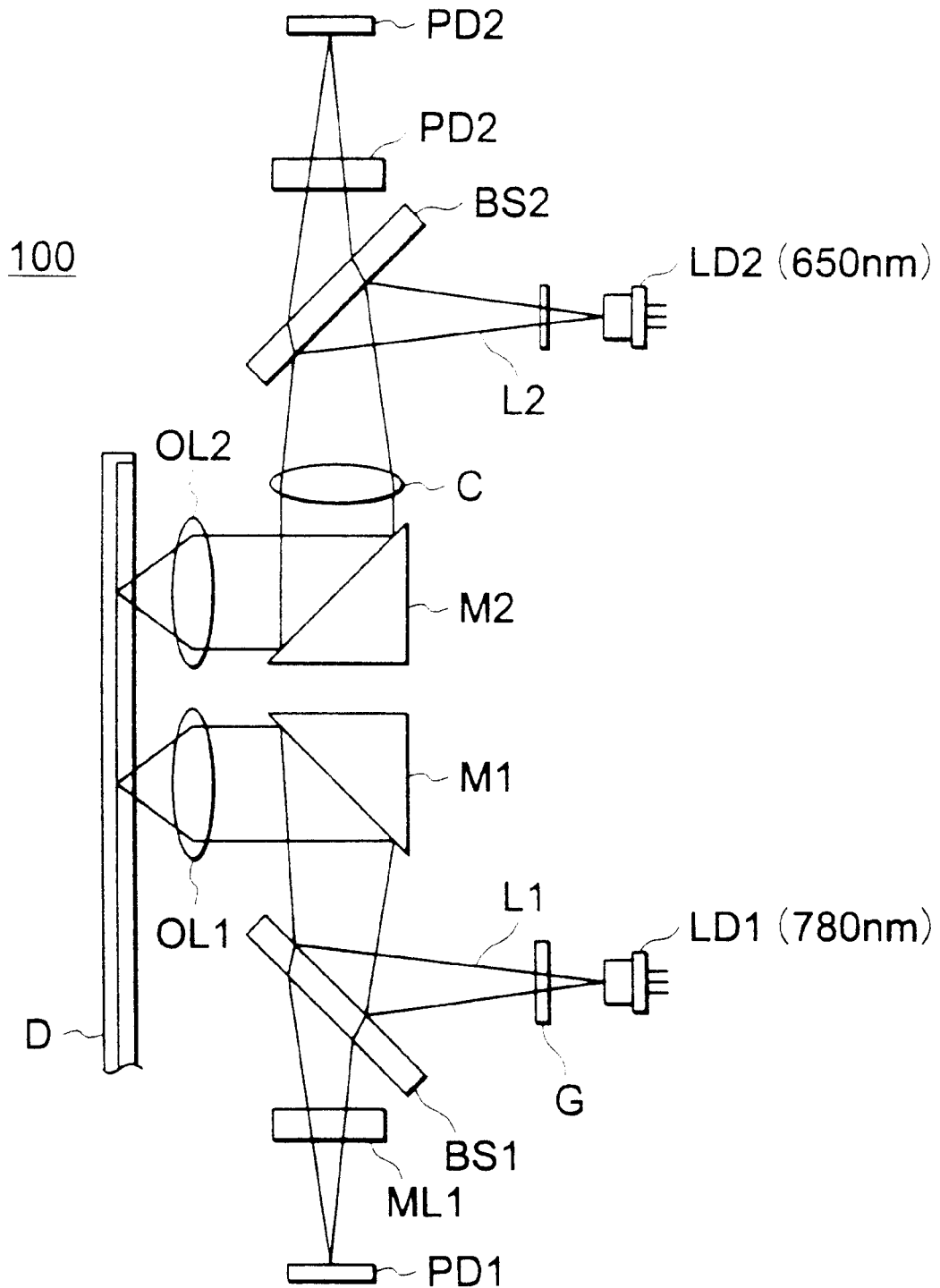
FIG. 1 is a view of the configuration of an optical pickup according to a first example of the related art.
Figure 2:
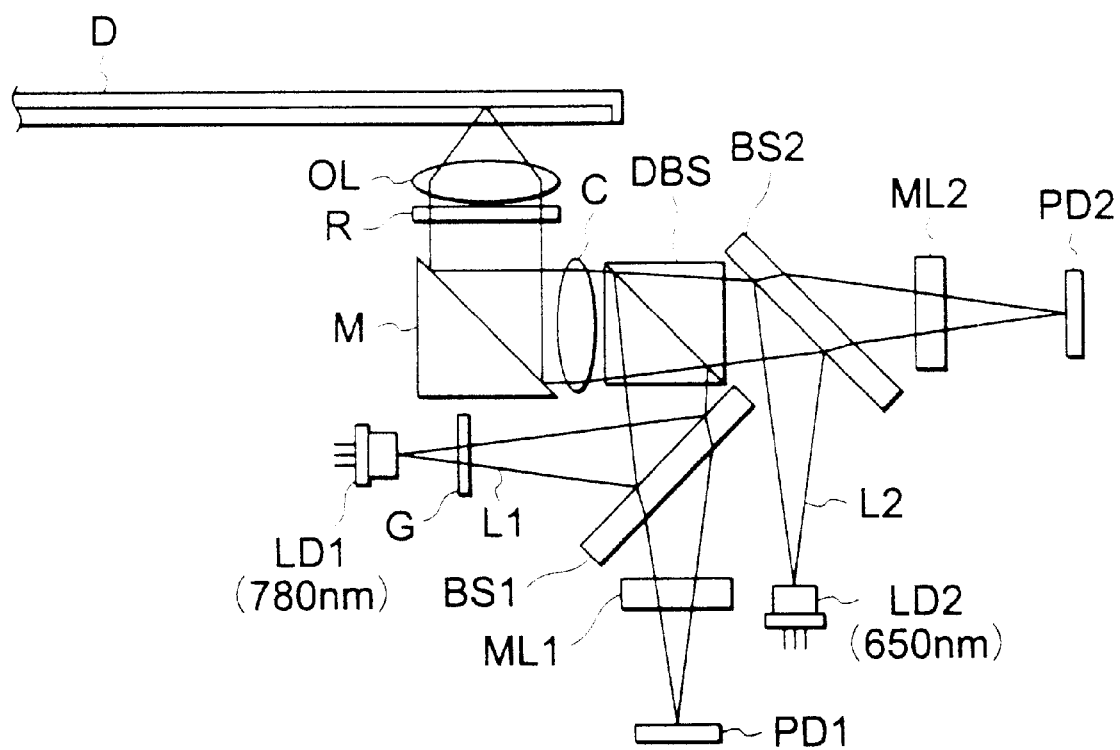
FIG. 2 is a view of the configuration of an optical pickup according to a second example of the related art.
Figure 3:
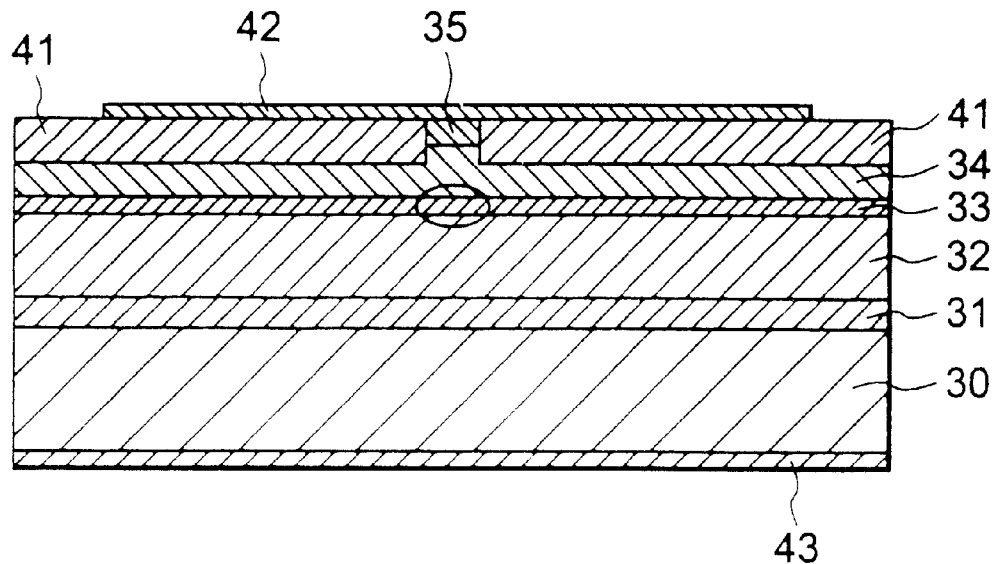
FIG. 3 is a sectional view of a laser diode used in the first and second examples of the related art.
Figure 4:
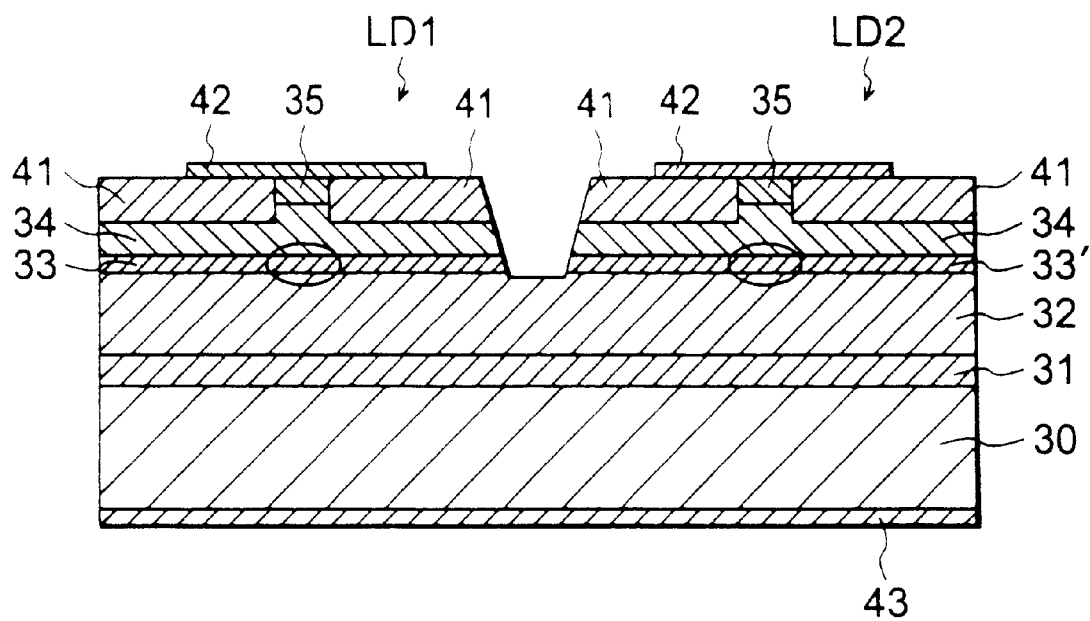
FIG. 4 is a sectional view of a laser diode having a plurality of light emitting elements of the examples of the related art.
Figure 5:
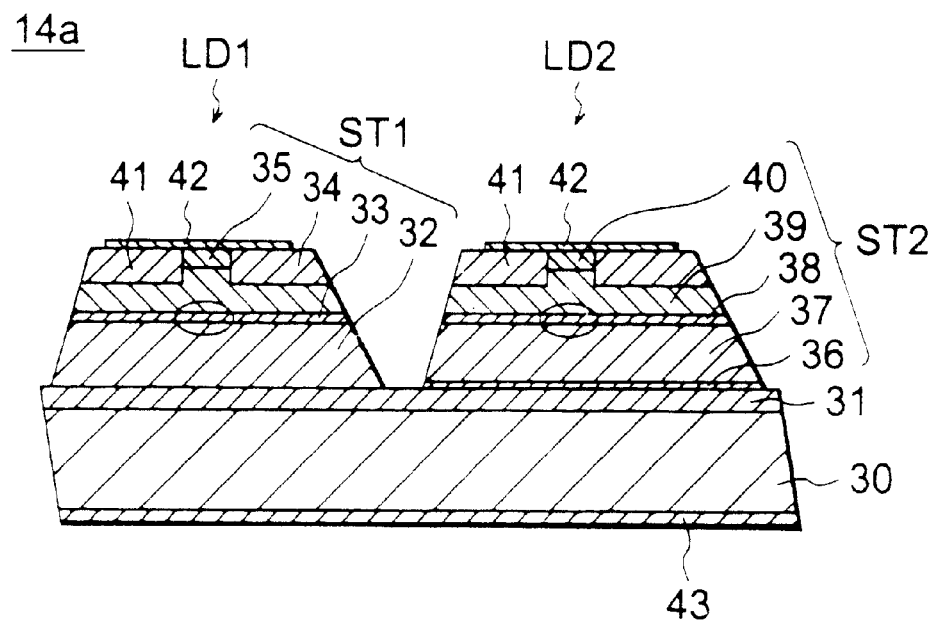
FIG. 5 is a sectional view of a laser diode according to a first embodiment of the present invention.

Below, preferred embodiments will be described with reference to the accompanying drawings.
First Embodiment A semiconductor light emitting device according to the present embodiment is a monolithic laser diode comprised of a CD laser diode LD1 (emission wavelength of 780 nm) and a DVD laser diode LD2 (emission wavelength of 650 nm) mounted on a single chip and suitable for forming a compatible optical pickup which can play back both a CD and DVD. A sectional view of the same is shown in FIG. 5.

The above monolithic laser diode 14a will be explained first.

A first stack ST1 for forming a first laser diode LD1 is formed by stacking on an n-type substrate 30 composed of for example GaAs an n-type buffer layer 31 composed of for example GaAs, an n-type clad layer 32 for example composed of AlGaAs, an active layer 33, a p-type clad layer 34 composed of for example AlGaAs, and a p-type cap layer 35 composed of for example GaAs. A stripe for forming a current narrowing structure of a gain-guide type is formed by an insulated region 41 from the surface of the p-type cap layer 35 to the middle of the p-type clad layer 34.

On the other hand, a second stack ST2 for forming a second laser diode LD2 is formed by stacking on the n-type substrate 30 the n-type buffer layer 31 composed of for example GaAs, an n-type buffer layer 36 composed of for example InGaP, an n-type clad layer 37 composed of for example AlGaInP, an active layer 38, a p-type clad layer 39 composed of for example AlGaInP, and a p-type cap layer 40 composed of for example GaAs. A stripe for forming a current narrowing structure of a gain-guide type is formed by an insulated region 41 from the surface of the p-type cap layer 40 to the middle of the p-type clad layer 39.

In the above first laser diode LD1 and second laser diode LD2, p-type electrodes 42 are formed connected to the p-type cap layers (35, 40), and an n-type electrode 43 is formed connected to the n-type substrate.

In the monolithic laser diode 14a of the above configuration, the interval between a laser light emitting portion of the first laser diode LD1 and a laser light emitting portion of the second laser diode LD2 is set to a range of, for example, not more than 200 $\mu$m or so (100 $\mu$m or so). Laser light L1 having a wavelength of, for example, the 780 nm band and laser light L2 having a wavelength of the 650 nm band are emitted in parallel with the substrate and substantially in the same direction (almost parallel) from the respective laser light emitting portions.

The laser diode 14a of the above configuration is a monolithic laser diode comprised of two kinds of laser diodes with different emission wavelengths mounted on a single chip and suitable for forming an optical pickup of CD, DVD, or other different wavelength optical disk systems.

Figure 6:
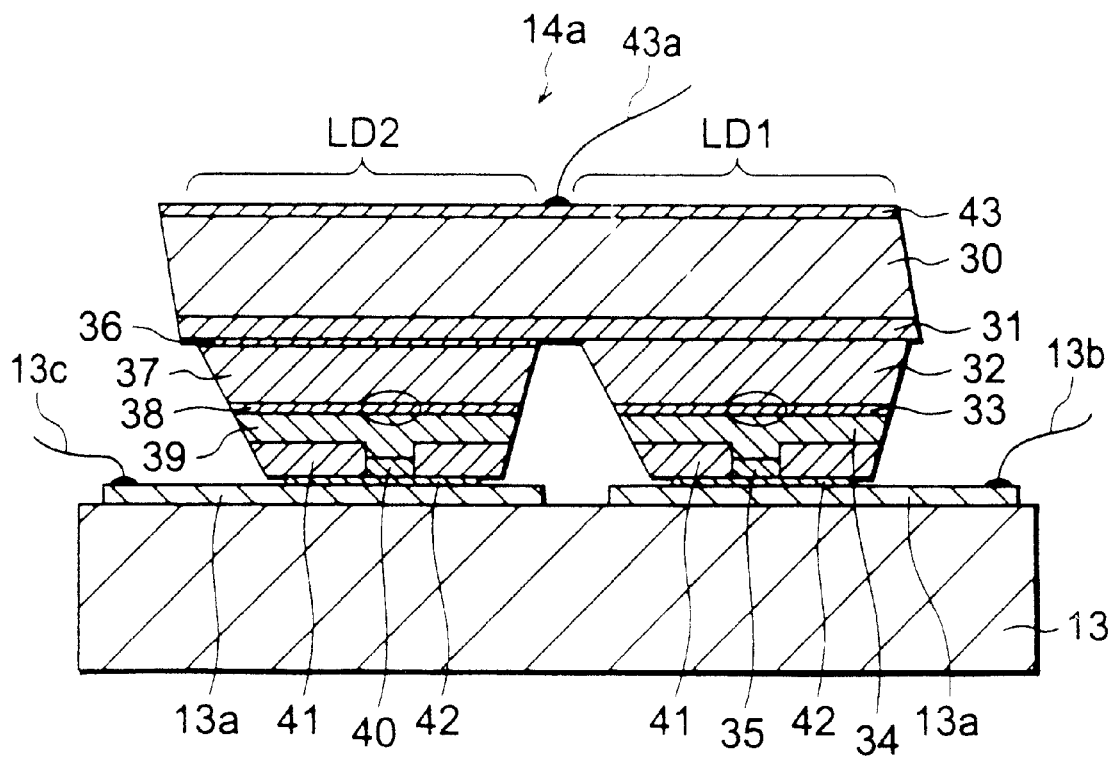
FIG. 6 is a sectional view of an example of use of a laser diode according to the first embodiment.

The above monolithic laser diode 14a is, for example as shown in FIG. 6, used connected and secured by solder to electrodes 13a formed on a semiconductor block 13 from the p-type electrode 42 side.

In this case, for example, voltages are supplied by a lead 13b to the electrode 13a for connecting the p-type electrode 42 of the first laser diode LD1, by a lead 13c to the electrode 13a for connecting the p-type electrode of the second laser diode LD2, and by a lead 43a to an n-type electrode 43 shared by the laser diodes (LD1 and LD2).

Figure 7A:
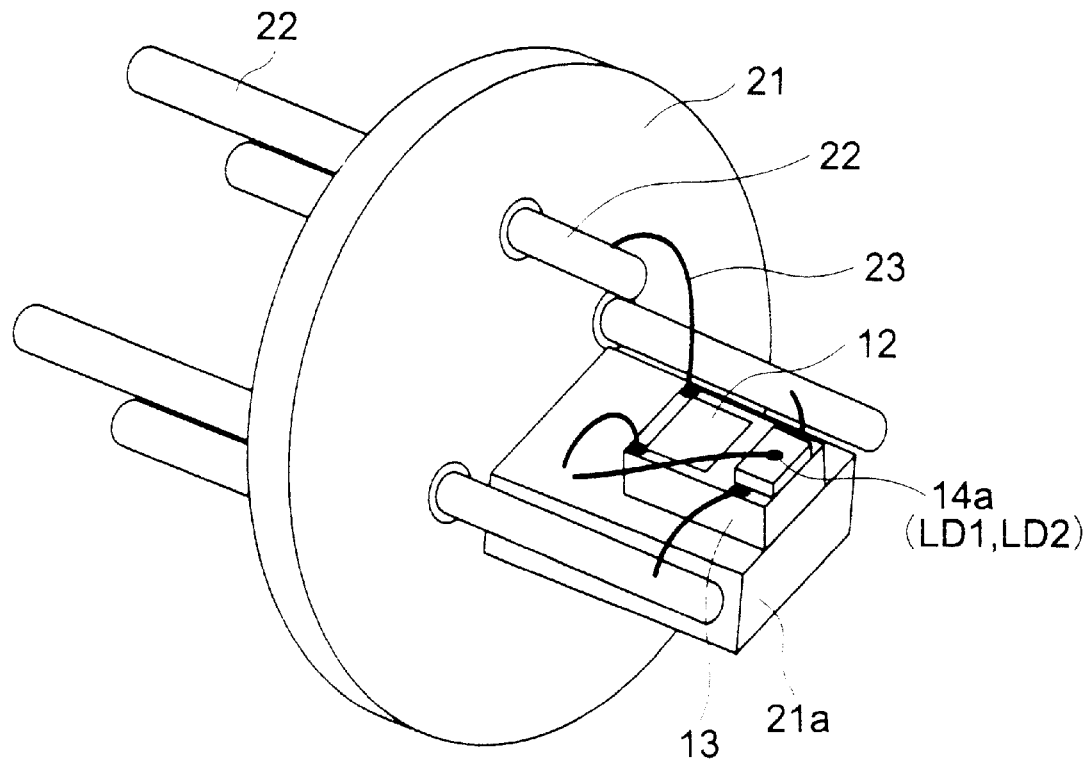
FIG. 7A is a perspective view of the configuration of a laser diode according to the first embodiment mounted in a CAN package.

FIG. 7A is a perspective view of an example of the configuration when the above monolithic laser diode 14a is mounted in a CAN package.

For example, the semiconductor block 13 on which a PIN diode 12 is formed as a monitor-use optical detection element is fixed on a projection 21a provided on a disk-shaped base 21. The monolithic laser diode 14a comprised of the first and second laser diodes (LD1 and LD2) mounted on a single chip is arranged on top of this.

Terminals 22 are provided penetrating through the base 1 and are connected by leads 23 to the above first and second laser diodes (LD1 and LD2) or the PIN diode 12 whereby drive power is supplied to each of the diodes.

Figure 7B:
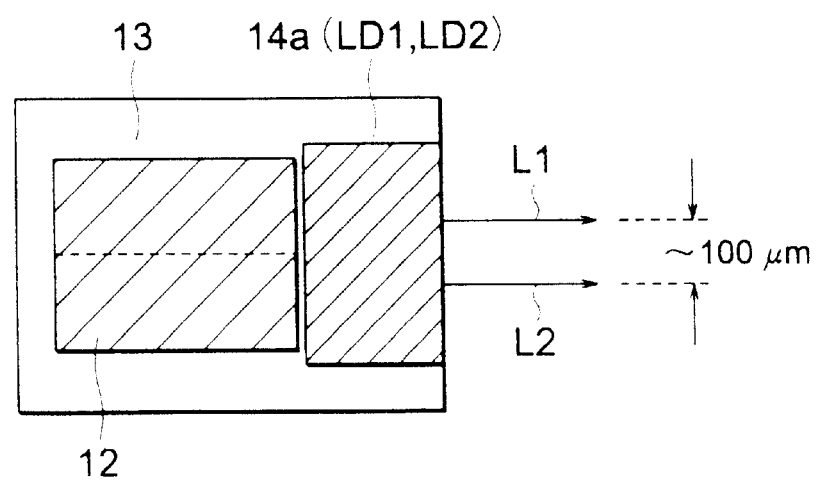
FIG. 7B is a plan view of an important portion thereof.

FIG. 7B is a plan view of an important part of the laser diode in the above CAN package seen from a direction orthogonal to the laser light emitting direction.

The laser diode 14a comprising the first laser diode LD1 and second laser diode LD2 mounted on a single chip is arranged on the semiconductor block 13 on which the PIN diode 12 is formed.

The PIN diode 12 performs automatic power control (APC) for detecting the laser light emitted to the rear side of the first and second diodes (LD1 and LD2), measuring the intensities, and controlling the drive currents of the first and second laser diodes (LD1 and LD2) in order to keep the intensities of the laser light constant.

Figure 8:
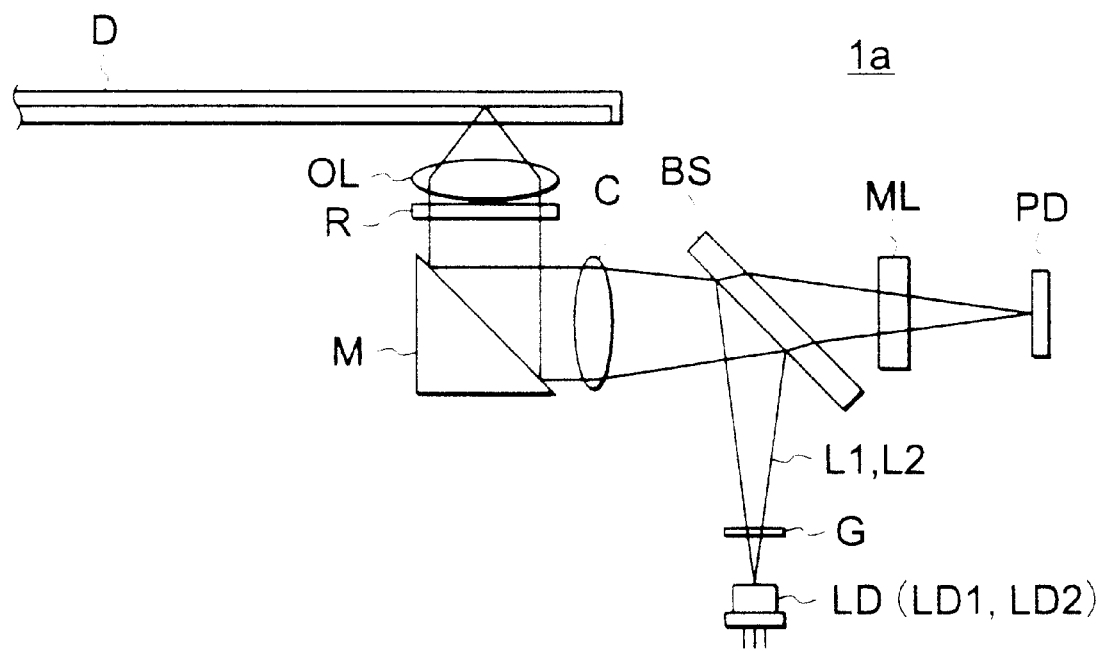
FIG. 8 is a schematic view of the configuration of an optical pickup using a laser diode in the CAN package of FIGS. 7A and 7B.

FIG. 8 is a schematic view of the configuration when using a laser diode LD comprised of a monolithic laser diode, comprised of the above first laser diode LD1 and second laser diode LD2 mounted on a single chip, in a CAN package so as to form an optical pickup of CD, DVD, and other different wavelength optical disk systems.

The optical pickup 1a contains separately configured, that is, discretely composed, optical systems, and for example is provided with a monolithic laser diode LD comprised of a first laser diode LD1 for emitting laser light having a wavelength of for example the 780 nm band and a second laser diode LD2 for emitting laser light having a wavelength of the 650 nm band mounted on a single chip, a grating G for the 780 nm band which passes the 650 nm band, a beam splitter BS, a collimeter C, a mirror M, a CD aperture R, an object lens OL, a multiple lens ML, and a photodiode PD arranged at predetermined positions. The photodiode PD comprises a first photodiode for receiving light of, for example, the 780 nm band and a second photodiode for receiving light of the 650 nm band formed adjacent to each other and in parallel.

In the optical pickup 1a of the above configuration, first laser light L1 from the first laser diode LD1 passes through the grating G, is partially reflected by the beam splitter BS, passes through or is reflected at the collimeter C, the mirror M, and the CD aperture R, and then is converged on the optical disk D by the object lens OL.

The reflected light from the optical disk D passes through the multiple lens ML via the object lens OL, the CD aperture R, the mirror M, the collimeter C, and the beam splitter BS and strikes the photodiode PD (first photodiode). Information recorded on the recording surface of the CD or other optical disk D is read by the change of the reflected light.

In the optical pickup 1a of the above configuration, second laser light L2 from the second laser diode LD2 is also converged on the optical disk D via the same path as the above and the reflected light thereof strikes the photodiode PD (second photodiode). Information recorded on the recording surface of the DVD or other optical disk D is read by the change of the reflected light.

According to the above optical pickup 1a, a CD laser diode and a DVD laser diode are mounted and a common optical system is used to converge the reflected light to a CD photodiode and a DVD photodiode so as to enable playback of a CD and DVD.

Figure 9A:
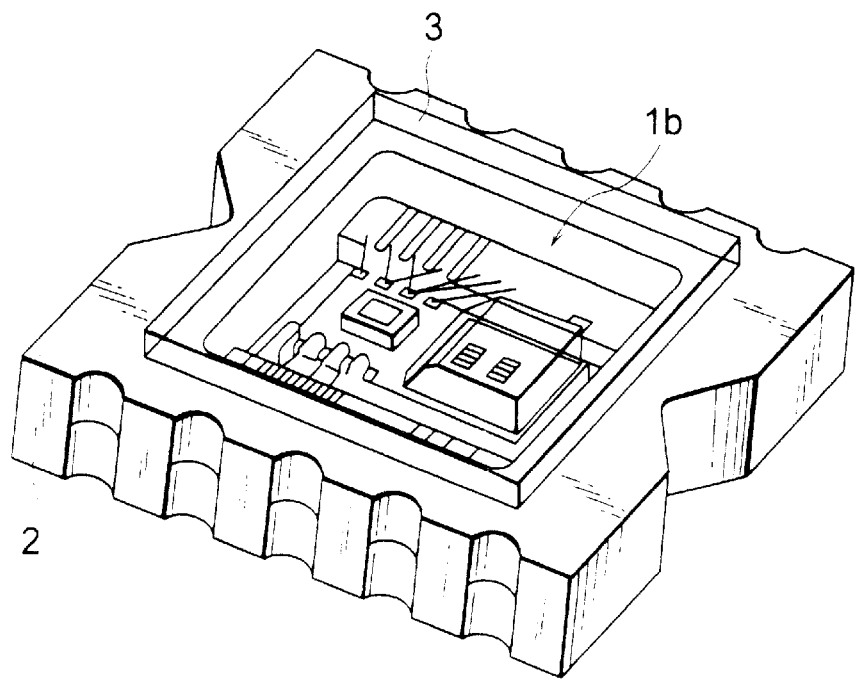
FIG. 9A is a perspective view of the configuration of a case where a laser diode according to the first embodiment is installed in a laser coupler.

It is also possible to use the monolithic laser diode comprised of the first laser diode LD1 and second laser diode LD2 mounted on a single chip according to the present embodiment to construct a laser coupler suitable for an optical pickup for recording and playback by emission of light to a CD, DVD, or other optical recording medium. FIG. 9A is a view for explaining the general configuration of the above laser coupler 1b. The laser coupler 1b is mounted in a depression of a first package member 2 and sealed with glass or another transparent second package member 3.

Figure 9B:
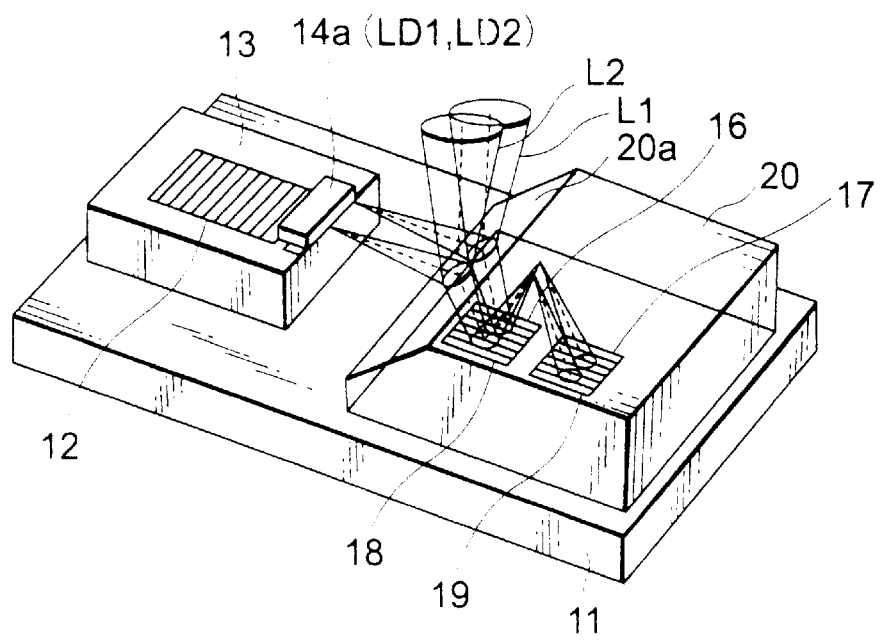
FIG. 9B is a perspective view of an important portion thereof.

FIG. 9B is a perspective view of an important portion of the above laser coupler.

For example, the laser coupler comprises an integrated circuit substrate 11, that is, a substrate cut out from a silicon monocrystal, a semiconductor block 13 formed with a PIN diode 12 forming a monitor-use optical detection element arranged on the substrate, and a monolithic laser diode 14a comprised of a first laser diode LD1 and second laser diode LD2 mounted on a single chip as light emitting elements arranged on the semiconductor block 13.

On the other hand, the integrated circuit substrate 11 has for example first photodiodes (16, 17) and second photodiodes (18, 19) formed on it. The first and second photodiodes (16, 17, 18, and 19) have placed over them a prism 20 at a predetermined distance from the first and second laser diodes (LD1 and LD2).

Laser light L1 emitted from the first laser diode LD1 is partially reflected at a spectral surface 20a of the prism 20 and bent in direction, is emitted in the emission direction from an emission window formed in the second package member 3, and strikes an optical disk (CD) or other object via a not illustrated reflection mirror, object lens, etc.

The reflected light form the above object proceeds in the opposite direction from the incident direction to the object and strikes the spectral surface 20a from the emission direction from the laser coupler 1b. The light is focused at the upper surface of the prism 20 and strikes a front first photodiode 16 and a rear first photodiode 17 formed on the integrated circuit substrate 11 on the lower surface of the prism 20.

On the other hand, laser light L2 emitted from the second laser diode LD2 is partially reflected at the spectral surface 20a of the prism 20 in the same way as in the above and bent in proceeding direction, is emitted in the emission direction from an emission window formed in the second package, and strikes an optical disk (DVD) or other object via a not illustrated reflection mirror, object lens, etc.

The reflected light from the above object proceeds in the opposite direction from the incident direction to the object and strikes the spectral surface 20a of the prism 20 from the emission direction from the laser coupler 1b. The light is focused at the upper surface of the prism 20 and strikes a front second photodiode 18 and a rear second photodiode 19 formed on the integrated circuit substrate 11 at the bottom surface of the prism 20.

The PIN diode 12 formed on the semiconductor block 13 comprises for example two split regions and performs APC control for detecting the laser light emitted to the rear side for the first and second laser diodes (LD1 and LD2), measuring the intensities of the laser light, and controlling the driving currents of the first and second laser diodes (LD1 and LD2) in order to keep the intensities of the laser light constant.

The distance between a laser light emission portion of the above first laser diode LD1 and a laser light emission portion of the second laser diode LD2 is set to a range of, for example, not more than 200 $\mu$m or so (100 $\mu$m or so). Laser light L1 having a wavelength of for example the 780 nm band and laser light L2 having a wavelength of the 650 nm band are emitted in substantially the same direction (substantially in parallel).

Figure 10:
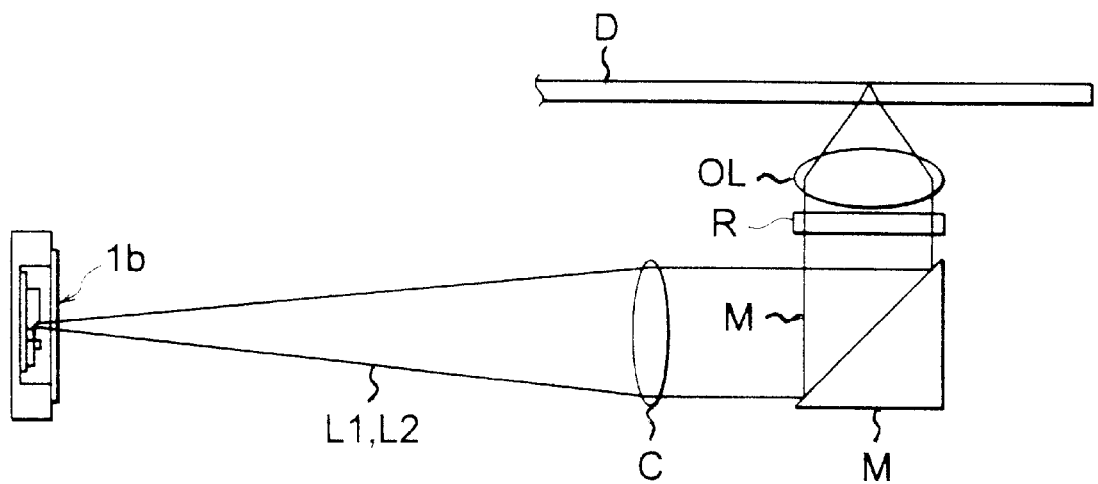
FIG. 10 is a schematic view of the configuration of an optical pickup using a laser diode in the laser coupler of FIGS. 9A and 9B.

An example of the configuration of an optical pickup using the above laser coupler is shown in FIG. 10. The laser light (L1 and L2) emitted from the first and second laser diodes provided in the laser coupler 1b strike a CD, DVD or other optical disk D via the collimeter C, the mirror M, the CD aperture R, and the object lens OL.

The reflected light from the optical disk D returns to the laser coupler via the same path as the emitted light and is received by the first and second photodiodes provided in the laser coupler.

As explained above, using the monolithic laser diode of the present embodiment enables an optical pickup of a CD, DVD, or other different wavelength optical disk system to be reduced in the number of parts, simplified in the configuration of the optical system, easily assembled, and made more compact and lower in cost.

The method of forming the above monolithic laser diode 14a comprising the first laser diode LD1 and second laser diode LD2 mounted on a single chip will be explained next.

Figure 11A:
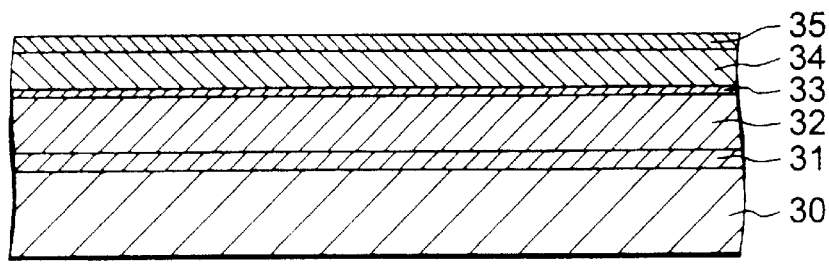

First, as shown in FIG. 11A, for example, by using metal organic vapor phase epitaxial growth (MOVPE) or another epitaxial growth method, on an n-type substrate 30 composed of for example GaAs, an n-type buffer layer 31 composed of for example GaAs, an n-type clad layer 32 composed of for example AlGaAs, an active layer 33 (having a multiplex quantum well structure having an oscillation wavelength of 780 nm), a p-type clad layer 34 composed of for example AlGaAs, and a p-type cap layer 35 composed of for example GaAs are successively stacked.

Figure 11B:
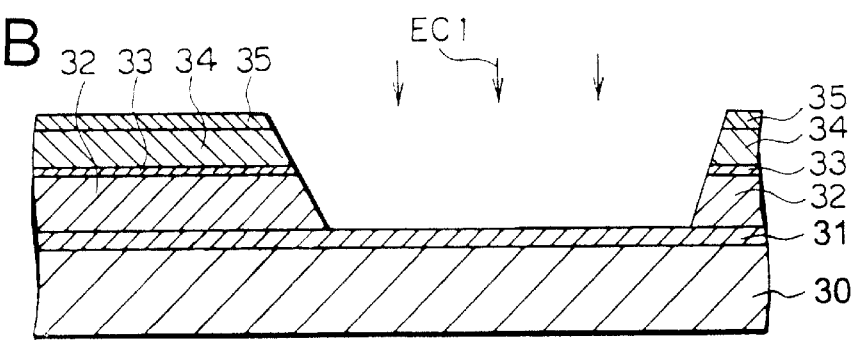

Next, as shown in FIG. 11B, a region left as the first diode LD1 is protected by a not shown resist film and sulfuric acid-based non-selective etching and fluoric acid-based AlGaAs selective etching or other wet etching (EC1) is used to remove the above stack up to the n-type clad layer 32 in the region other than the first laser diode LD1 region.

Figure 12A:
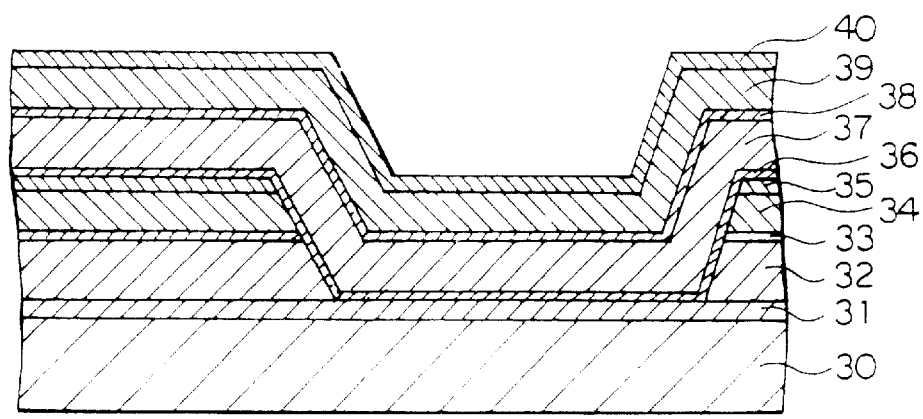

Next, as shown in FIG. 12A, for example, by using metal organic vapor phase epitaxial growth (MOVPE) or another epitaxial growth method, on the n-type buffer layer 31, an n-type buffer layer 36 composed of for example InGaP, an n-type clad layer 37 composed of for example AlGaInP, an active layer 39 (having a multiplex quantum well structure having an oscillation wavelength of 650 nm), a p-type clad layer 39 composed of for example AlGaInP, and a p-type cap layer 40 composed of for example GaAs are successively stacked.

Figure 12B:
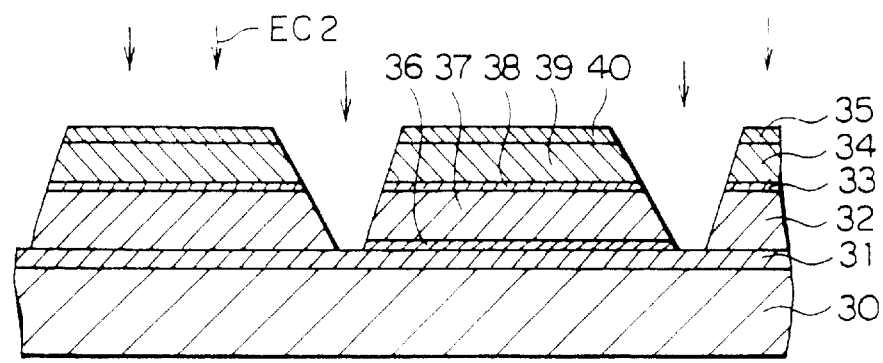

Next, as shown in FIG. 12B, a region to be left as a second laser diode LD2 is protected by a not shown resist film and sulfuric acid-based cap etching, phosphoric acid and hydrochloric acid-based four-elements selective etching, hydrochloric acid-based separation etching, or other wet etching (EC2) is used to remove the above stack up to the n-type buffer layer 36 in the region other than the second laser diode LD2 region and separate the first laser diode LD1 and second laser diode LD2.

Figure 13A:
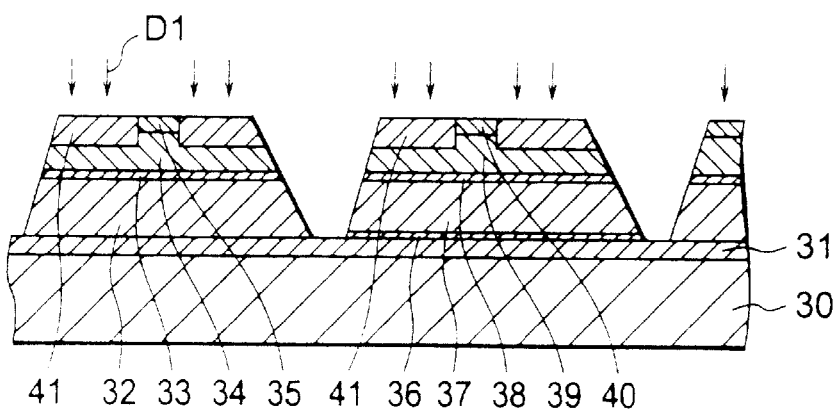

Next, as shown in FIG. 13A, the parts for forming the current injection regions are protected by a resist film and an impurity D1 is doped by ion implantation etc. to form insulated regions 41 from the surface of the p-type cap layers (35, 40) to the middle of the p-type clad layers (34, 39) to give stripes for forming current narrowing structures of the gain guide type.

Figure 13B:
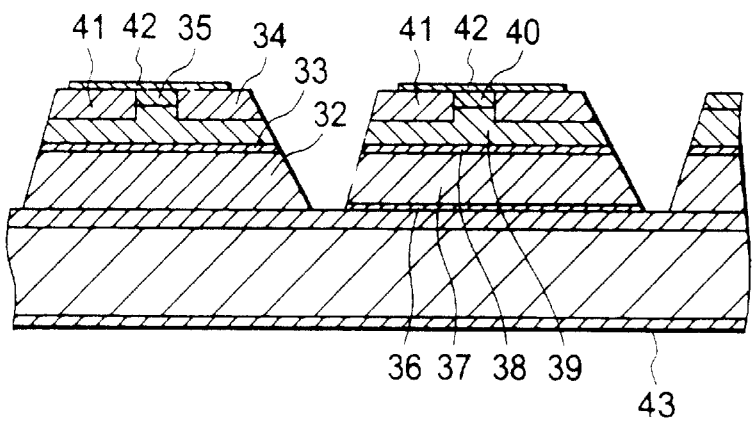

Next, as shown in FIG. 13B, p-type electrodes 42 of Ti/Pt/Au etc. are formed connected to the p-type cap layers (35, 40), while an n-type electrode 43 of AuGe/Ni/Au etc. is formed connected to the n-type substrate 30.

After this, it is possible to use a pelletizing step to form the desired monolithic laser diode 14a comprised of the first laser diode LD1 and second laser diode LD2 mounted on a single chip as shown in FIG. 5.

According to the method of producing a monolithic laser diode of the above embodiment, it is possible to form a monolithic laser diode comprised of a first laser diode and a second laser diode formed with different compositions of active layers etc. to enable emission of different wavelengths of laser light.

Second Embodiment

Figure 14:
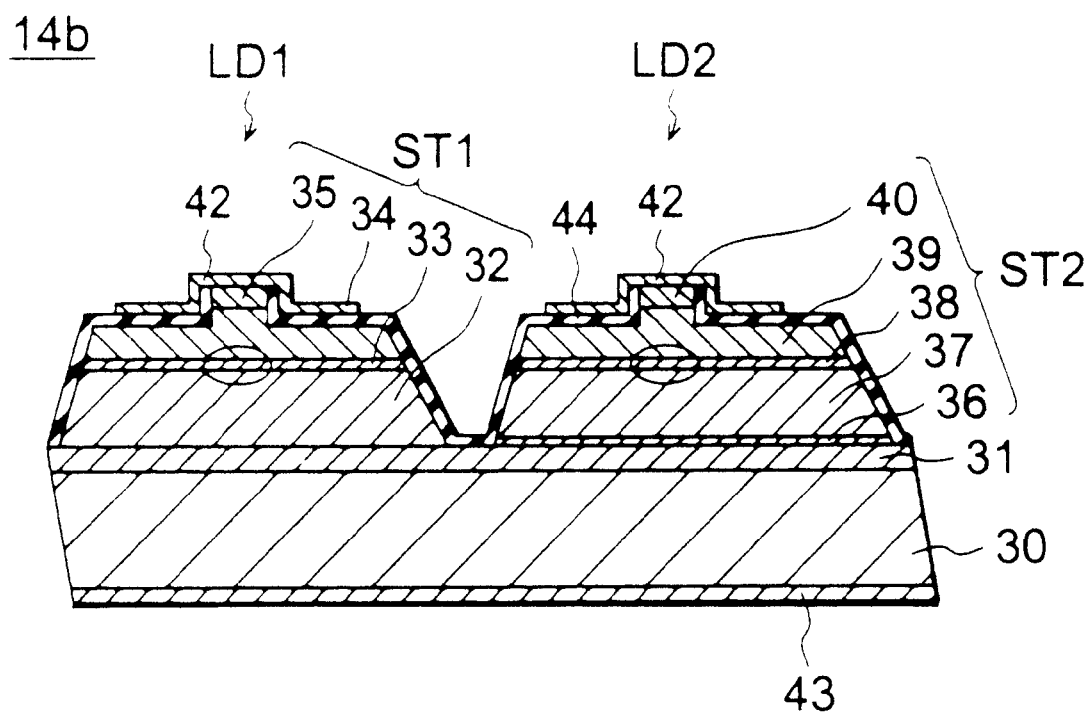
FIG. 14 is a sectional view of a laser diode according to a second embodiment of the present invention.

The semiconductor light emitting device according to the second embodiment is substantially the same as the monolithic laser diode according to the first embodiment. It comprises a CD laser diode LD1 (emission wavelength of 780 nm) and a DVD laser diode LD2 (emission wavelength of 650 nm) mounted on a single chip and is suitable for forming a compatible optical pickup which can play back both a CD and DVD. A sectional view of the same is shown in FIG. 14.

The above monolithic laser diode 14b will be explained first.

A first stack ST1 for forming a first laser diode LD1 is formed by stacking on an n-type substrate 30 composed of for example GaAs an n-type buffer layer 31 composed of for example GaAs, an n-type clad layer 32 for example composed of AlGaAs, an active layer 33, a p-type clad layer 34 composed of for example AlGaAs, and a p-type cap layer 35 composed of for example GaAs. The first stack is processed to a ridge shape (projecting shape) from the surface of the p-type cap layer 35 to the middle of the p-type clad layer 34 to give a stripe for forming a current narrowing structure of a gain guide type.

The depth, shape, etc. of the ridge may be controlled to facilitate the fabrication of an index guide, self-pulsation type, etc.

On the other hand, a second stack ST2 for forming a second laser diode LD2 is formed by stacking on the n-type substrate 30 the n-type buffer layer 31 composed of for example GaAs, an n-type buffer layer 36 composed of for example InGaP, an n-type clad layer 37 composed of for example AlGaInP, an active layer 38, a p-type clad layer 39 composed of for example AlGaInP, and a p-type cap layer 40 composed of for example GaAs. The second stack is processed to a ridge shape (projecting shape) from the surface of the p-type cap layer 40 to the middle of the p-type clad layer 39 to give a stripe for forming a current narrowing structure of a gain guide type.

In the same way as with the first laser diode LD1, the depth, shape, etc. of the ridge may be controlled to facilitate the fabrication of an index guide, self-pulsation type, etc.

Furthermore, a silicon oxide or other insulating film 44 is formed covering the above first laser diode LD1 and the second laser diode LD2. The insulating film 44 is formed with contact openings for exposing the p-type cap layers (35, 40). Furthermore, p-type electrodes 42 are formed connecting to the p-type cap layers (35, 40) and an n-type electrode 43 is formed connecting to the n-type substrate 30.

In this case, only if there is no ohmic contact at parts other than the stripes, the insulating film 44 is not always necessary.

In the monolithic laser diode 14b of the above configuration, laser light L1 having a wavelength of for example the 780 nm band and laser light L2 having a wavelength of for example the 650 nm band are emitted in parallel with the substrate in substantially the same direction (substantially in parallel).

The laser diode 14b of the above configuration is a monolithic laser diode comprised of two kinds of laser diodes of different emission wavelengths mounted on a single chip suitable for constructing an optical pickup of a CD, DVD, or other different wavelength optical disk system.

The method of forming the above monolithic laser diode 14b will be explained next.

Figure 15A:
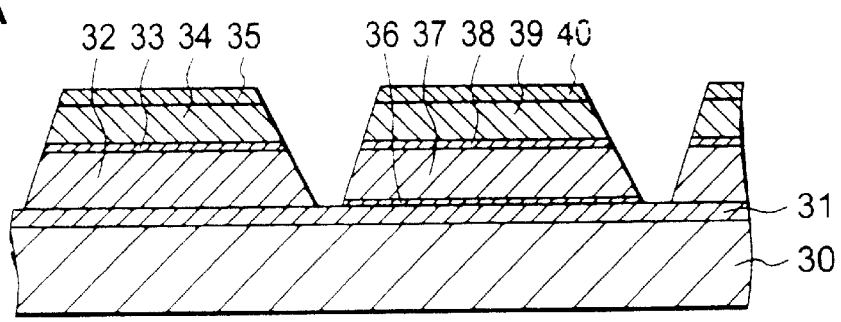

First, the steps up to FIG. 15A are the same as in the first embodiment up to the step shown in FIG. 12B.

Figure 15B:
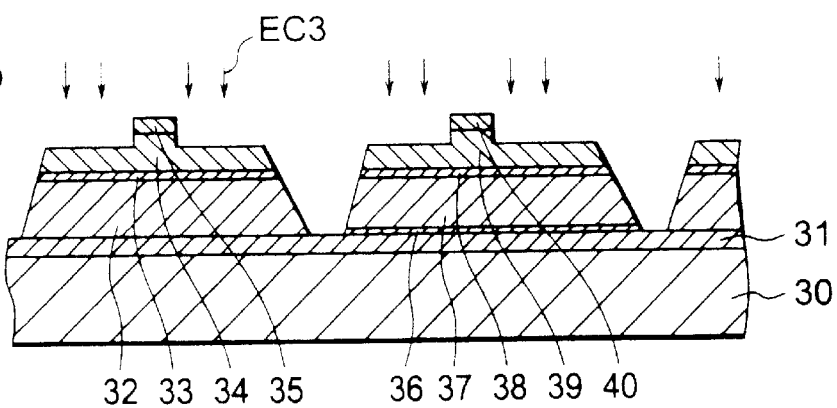

Next, as shown in FIG. 15B, the parts to form the current injection regions are protected by an insulating film etc. and etching EC3 is performed to form stripes for forming current narrowing structures of a gain guide type by processing to form ridge shapes (projecting shapes) from the surface of the p-type cap layers (35, 40) to the middle of the p-type clad layers (34, 39).

Figure 16A:
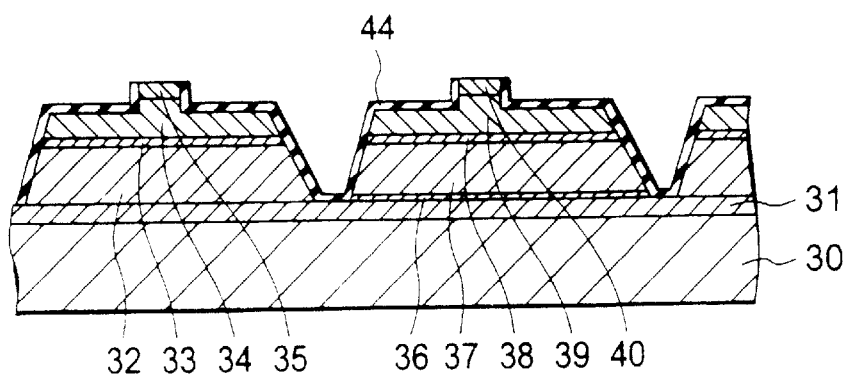

Next, as shown in FIG. 16A, for example, chemical vapor deposition (CVD) is used to deposit silicon oxide over the entire surface and contact openings are formed to expose the p-type cap layers (35, 40).

Figure 16B:
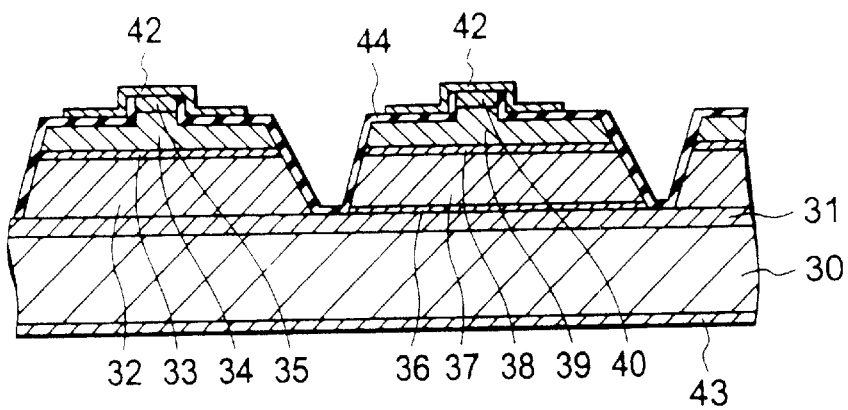

Next, as shown in FIG. 16B, p-type electrodes 42 of Ti/Pt/Au etc. formed connected to the p-type cap layers (35, 40), while an n-type electrode 43 of AuGe/Ni/Au etc. is formed connected to the n-type substrate 30.

After this, it is possible to use a pelletizing step to form the desired monolithic laser diode 14b comprised of the first laser diode LD1 and second laser diode LD2 mounted on a single chip as shown in FIG. 14.

According to the method of producing a monolithic laser diode of the above embodiment, it is possible to form a monolithic laser diode enabling emission of different wavelengths of laser light in the same way as the first embodiment.

Third Embodiment

Figure 17:
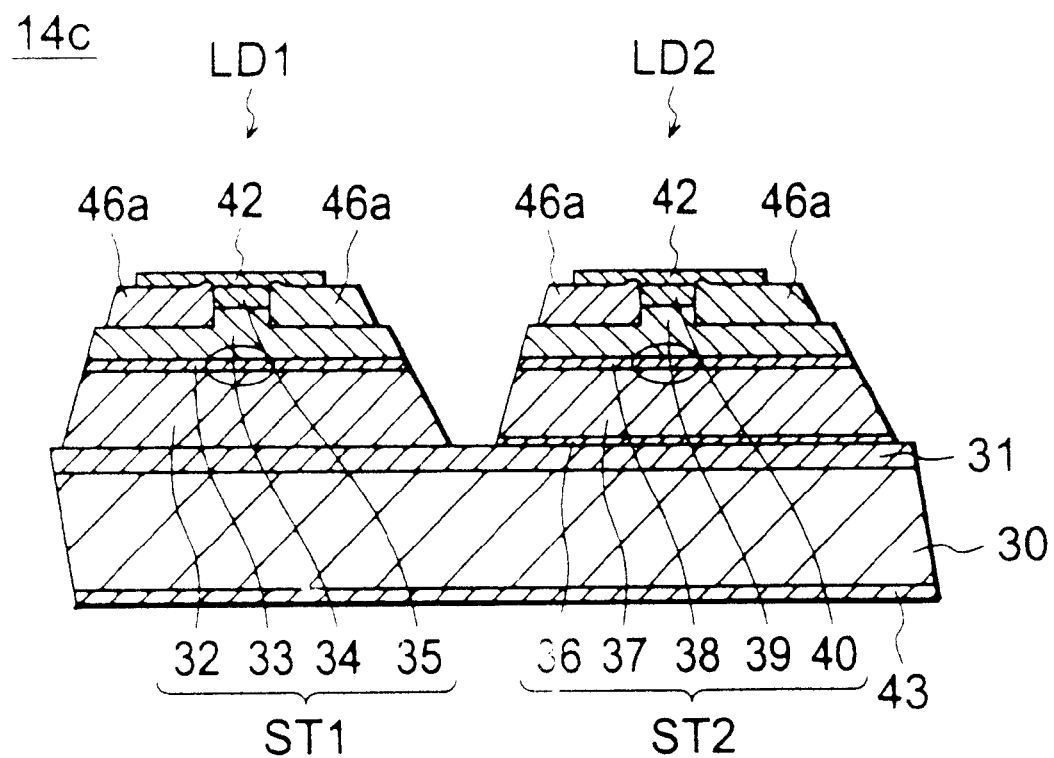
FIG. 17 is a sectional view of a laser diode according to a third embodiment of the present invention.

The semiconductor light emitting device according to the third embodiment is substantially the same as the monolithic laser diode according to the first embodiment. It comprises a CD laser diode LD1 (emission wavelength of 780 nm) and a DVD laser diode LD2 (emission wavelength of 650 nm) mounted on a single chip and is suitable for forming a compatible optical pickup which can play back both a CD and DVD. A sectional view of the same is shown in FIG. 17.

The above monolithic laser diode 14c will be explained first.

A first stack ST1 for forming a first laser diode LD1 is formed by stacking on an n-type substrate 30 composed of for example GaAs an n-type buffer layer 31 composed of for example GaAs, an n-type clad layer 32 for example composed of AlGaAs, an active layer 33, a p-type clad layer 34 composed of for example AlGaAs, and a p-type cap layer 35 composed of for example GaAs. The first stack is processed to a ridge shape (projecting shape) from the surface of the p-type cap layer 35 to the middle of the p-type clad layer 34 to and an n-type layer 46a composed of for example GaAs is formed to give a stripe for forming a current narrowing structure of a gain guide type.

The depth, shape, etc. of the ridge may be controlled to facilitate the fabrication of an index guide, self-pulsation type, etc.

On the other hand, a second stack ST2 for forming a second laser diode LD2 is formed by stacking on the n-type substrate 30 the n-type buffer layer 31 composed of for example GaAs, an n-type buffer layer 36 composed of for example InGaP, an n-type clad layer 37 composed of for example AlGaInP, an active layer 38, a p-type clad layer 39 composed of for example AlGaInP, and a p-type cap layer 40 composed of for example GaAs. The second stack is processed to a ridge shape (projecting shape) from the surface of the p-type cap layer 40 to the middle of the p-type clad layer 39 and an n-type layer 46a similar to the above is formed to give a stripe for forming a current narrowing structure of a gain guide type.

In the same way as with the first laser diode LD1, the depth, shape, etc. of the ridge may be controlled to facilitate the fabrication of an index guide, self-pulsation type, etc.

Furthermore, p-type electrodes 42 are formed connecting to the p-type cap layers (35, 40) while an n-type electrode 43 is formed connecting to the n-type substrate 30.

In the monolithic laser diode 14c of the above configuration, laser light L1 having a wavelength of for example the 780 nm band and laser light L2 having a wavelength of for example the 650 nm band are emitted in parallel with the substrate in substantially the same direction (substantially in parallel).

The laser diode 14c of the above configuration is a monolithic laser diode comprised of two kinds of laser diodes of different emission wavelengths mounted on a single chip suitable for constructing an optical pickup of a CD, DVD, or other different wavelength optical disk system.

The method of forming the above monolithic laser diode 14c will be explained next.

Figure 18A:
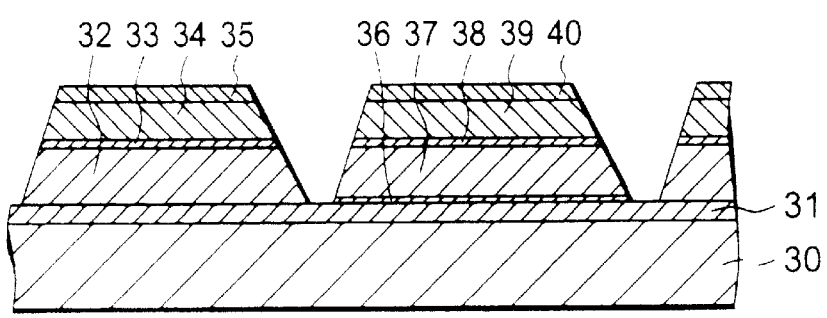

First, the steps up to FIG. 18A are the same as in the first embodiment up to the step shown in FIG. 12B.

Figure 18B:
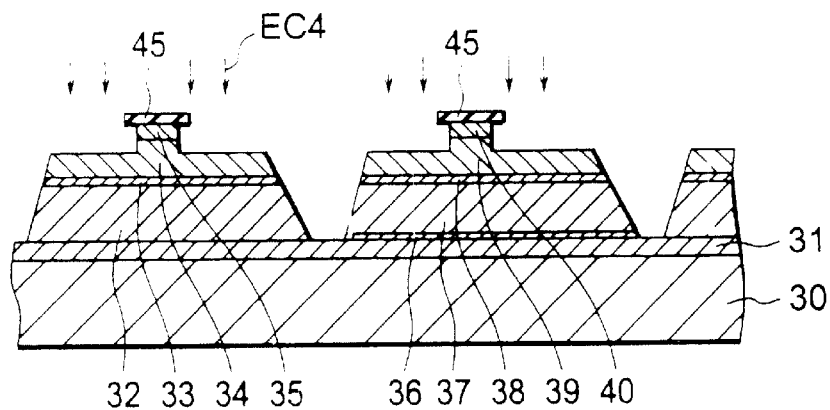

Next, as shown in FIG. 18B, the insulating film 45 is used as a mask to protect the parts for forming the current injection regions and etching EC4 is performed to form stripes for forming current narrowing structures of a gain guide type by processing to form ridge shapes (projecting shapes) from the surface of the p-type cap layers (35, 40) to the middle of the p-type clad layers (34, 39).

Figure 19A:
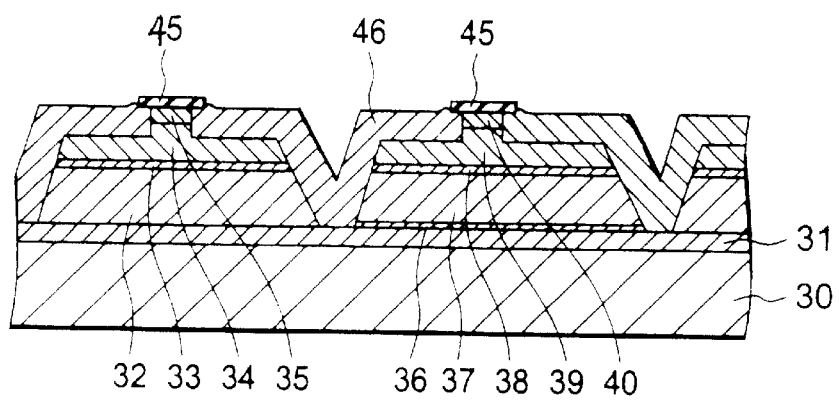

Next, as shown in FIG. 19A, an n-type layer 46 composed of for example GaAs is selectively grown while burying the parts etched to a ridge shape up to the middle depth of the p-type clad layers (34, 39).

Figure 19B:
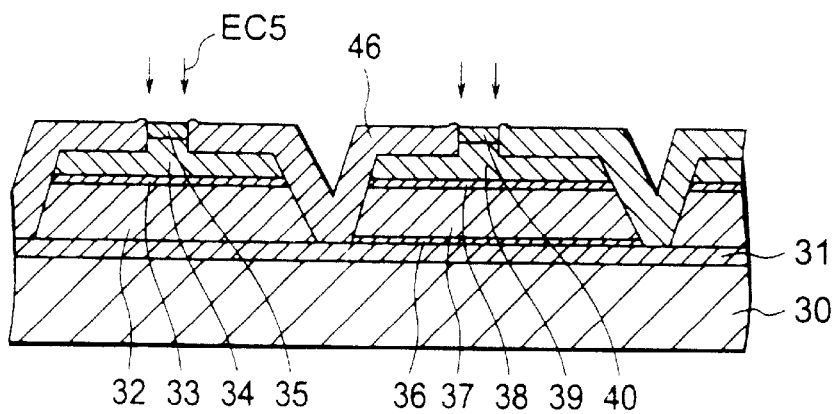

Next, as shown in FIG. 19B, the insulating film 45 is removed by etching EC5.

Figure 20A:
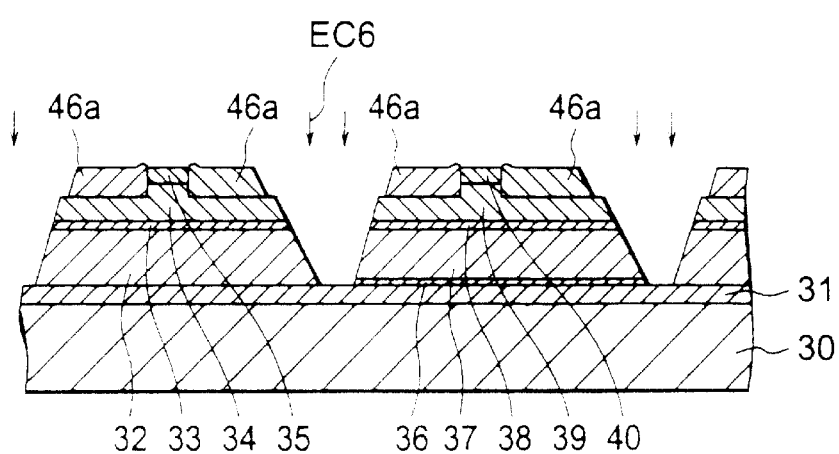

Next, as shown in FIG. 20A, the parts of the n-type layer 46 other than the parts etched to a ridge shape to the middle of the p-type clad layers (34, 39) are removed by the etching EC6.

Figure 20B:
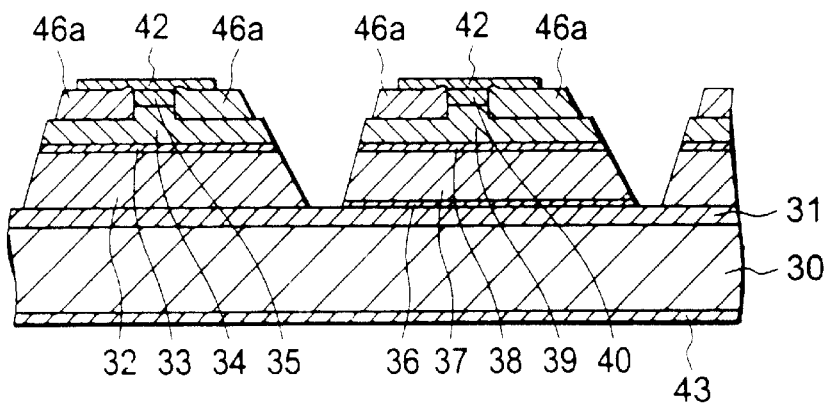

Next, as shown in FIG. 20B, p-type electrodes 42 of Ti/Pt/Au etc. are formed connected to the p-type cap layers (35, 40), while an n-type electrode 43 of AuGe/Ni/Au etc. is formed connected to the n-type substrate 30.

After this, it is possible to use a pelletizing step to form the desired monolithic laser diode 14c comprised of the first laser diode LD1 and second laser diode LD2 mounted on a single chip as shown in FIG. 17.

According to the method of producing a monolithic laser diode of the above embodiment, it is possible to form a monolithic laser diode enabling emission of different wavelengths of laser light in the same way as the first embodiment.

Figure 21A:
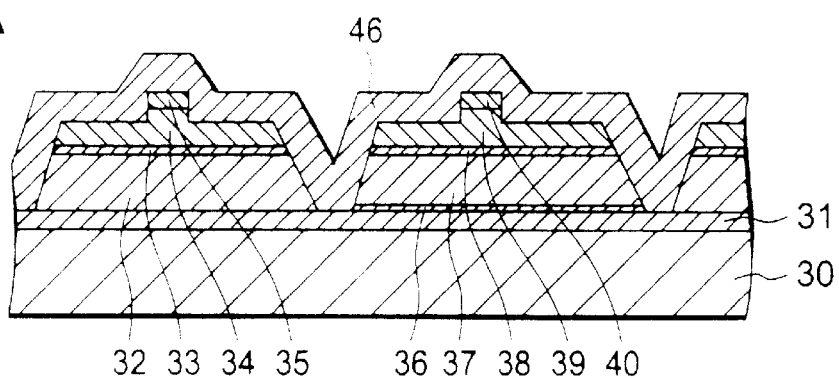
Figure 21B:
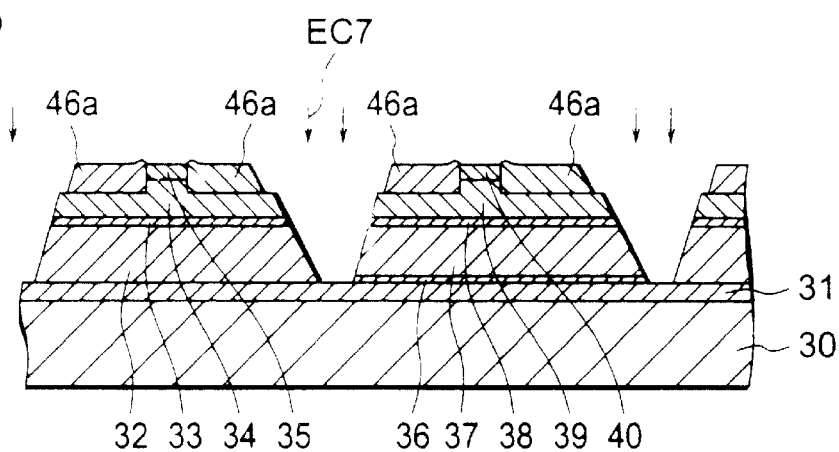

Also, in the method of production of the present embodiment, from the step shown in FIG. 18B, as shown in FIG. 21A, it is also possible to remove the insulating film 45 by etching, then grow an n-type layer 46 over the entire surface while burying the parts etched to the ridge shapes to the middle of the p-type clad layers (34, 39), then, as shown in FIG. 21B, remove the parts of the n-type layer 46 other than the parts etched to a ridge shape to the middle of the p-type clad layers (34, 39) by etching EC7.

Fourth Embodiment

Figure 22:
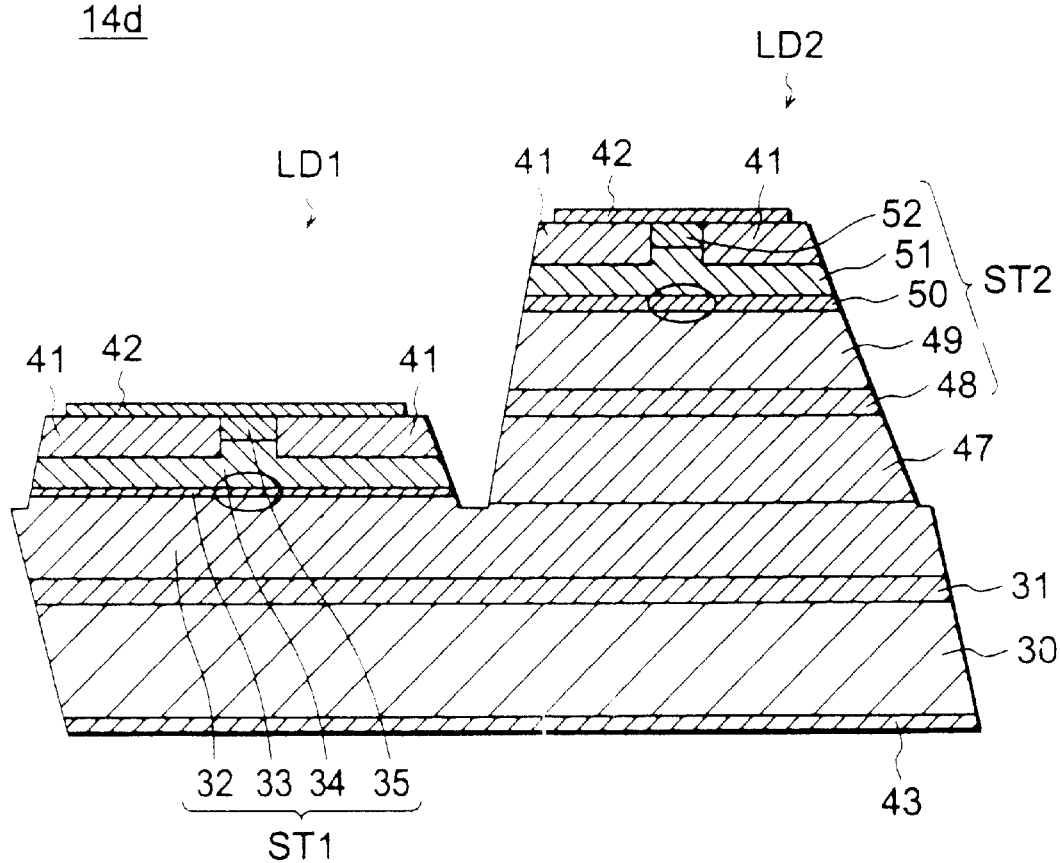
FIG. 22 is a sectional view of a laser diode according to a fourth embodiment of the present invention.

The semiconductor light emitting device according to the fourth embodiment comprises a CD laser diode LD1 (emission wavelength of 780 nm) and a DVD laser diode LD2 (emission wavelength of 650 nm) mounted on a single chip and is suitable for forming a compatible optical pickup which can play back both a CD and DVD. A sectional view of the same is shown in FIG. 22.

The above monolithic laser diode 14d will be explained first.

A first stack ST1 for forming a first laser diode LD1 is formed by stacking on an n-type substrate 30 composed of for example GaAs an n-type buffer layer 31 composed of for example GaAs, an n-type clad layer 32 for example composed of AlGaAs, an active layer 33, a p-type clad layer 34 composed of for example AlGaAs, and a p-type cap layer 35 composed of for example GaAs. An insulated region 41 is formed from the surface of the p-type cap layer 35 to the middle of the p-type clad layer 34 to give a stripe for forming a current narrowing structure of a gain guide type.

On the other hand, in the second laser diode LD2 region, the n-type buffer layer 31, n-type clad layer 32, active layer 33, p-type clad layer 34, and p-type cap layer 35 common with those of the first laser diode LD1 are stacked on the n-type substrate 30, but the region from the surface of the p-type cap layer 35 to the middle of the n-type clad layer 32 is diffused with silicon etc. to form the n-type region 47.

A second stack ST2 is formed by stacking on the above n-type region 47 an n-type buffer layer 48 composed of for example InGaP, an n-type clad layer 51 composed of for example AlGaInP, an active layer 50, a p-type clad layer 51 composed of for example AlGaInP, and a p-type cap layer 52 composed of for example GaAs. An insulated region 41 is formed from the surface of the p-type cap layer 52 to the middle of the p-type clad layer 51 to give a stripe for forming a current narrowing structure of a gain guide type.

Furthermore, p-type electrodes 42 are formed connecting to the p-type cap layers (35, 52), while an n-type electrode 43 is formed connecting to the n-type substrate 30.

In the monolithic laser diode 14d of the above configuration, laser light L1 having a wavelength of for example the 780 nm band and laser light L2 having a wavelength of for example the 650 nm band are emitted in parallel with the substrate in substantially the same direction (substantially in parallel).

The laser diode 14d of the above configuration is a monolithic laser diode comprised of two kinds of laser diodes of different emission wavelengths mounted on a single chip suitable for constructing an optical pickup of a CD, DVD, or other different wavelength optical disk system.

The method of forming the above monolithic laser diode 14d will be explained next.

Figure 23A:
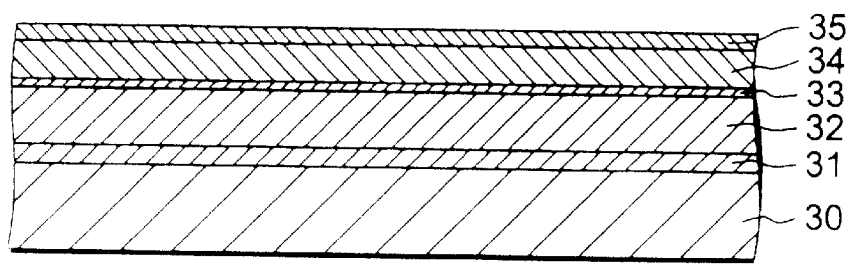

First, as shown in FIG. 23A, by using metal organic vapor phase epitaxial growth (MOVPE) or another epitaxial growth method, on an n-type substrate 30 composed of for example GaAs, an n-type buffer layer 31 composed of for example GaAs, an n-type clad layer 32 composed of for example AlGaAs, an active layer 33 (a multiplex quantum well structure having an oscillation wavelength of 780 nm), a p-type clad layer 34 composed of for example AlGaAs, and a p-type cap layer 35 composed of for example GaAs are successively stacked.

Figure 23B:
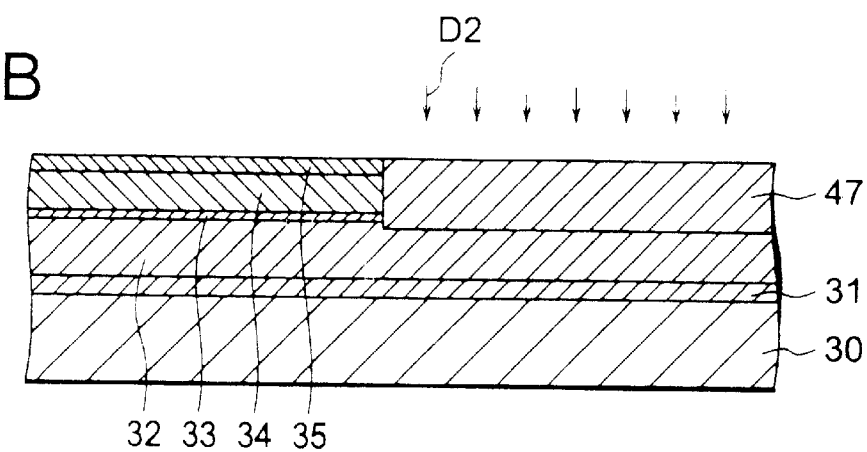

Next, as shown in FIG. 23B, silicon or another impurity D2 is diffused in the second laser diode formation region to make a region from the surface of the p-type cap layer 35 to the middle of the n-type clad layer 32 an n-type region 47.

Next, as shown in FIG. 24A, by using metal organic vapor phase epitaxial growth (MOVPE) or another epitaxial growth method, on the p-type cap layer 35 and the n-type region 47, an n-type buffer layer 48 composed of for example InGaP, an n-type clad layer 49 composed of for example AlGaInP, an active layer 50 (a multiplex quantum well structure having an oscillation wavelength of 650 nm), a p-type clad layer 51 composed of for example AlGaInP, and a p-type cap layer 52 composed of for example GaAs are successively stacked.

Next, as shown in FIG. 24B, sulfuric acid-based cap etching, phosphoric acid and hydrochloric acid-based four-elements selective etching, hydrochloric acid-based separation etching, or other wet etching (EC8) is used to remove the portions of the above stack other than that up to the p-type cap layer 35 in the first laser diode formation region and that up to the p-type cap layer 52 in the second laser diode formation region and separate the first laser diode LD1 and second laser diode LD2.

Next, as shown in FIG. 25A, the parts for forming the current injection regions are protected by a resist film and an impurity D3 is doped by ion implantation etc. to form insulated regions 41 from the surface of the p-type cap layers (35, 52) to the middle of the p-type clad layers (34, 51) to give stripes for forming current narrowing structures of the gain guide type.

Next, as shown in FIG. 25B, p-type electrodes 42 of Ti/Pt/Au etc. are formed connected to the p-type cap layers (35, 52), while an n-type electrode 43 of AuGe/Ni/Au etc. is formed connected to the n-type substrate 30.

After this, it is possible to use a pelletizing step to form the desired monolithic laser diode 14d comprised of the first laser diode LD1 and second laser diode LD2 mounted on a single chip as shown in FIG. 22.

According to the method of producing a monolithic laser diode of the above embodiment, it is possible to form a monolithic laser diode enabling emission of different wavelengths of laser light in the same way as the first embodiment. Also, it is possible to form the stack for forming the second laser diode on a flat surface (on the p-type cap layer 35 and the n-type region 47) and so the epitaxial growth can be carried out more easily.

Fifth Embodiment

The semiconductor light emitting device according to the fifth embodiment comprises a CD laser diode LD1 (emission wavelength of 780 nm) and a DVD laser diode LD2 (emission wavelength of 650 nm) mounted on a single chip and is suitable for forming a compatible optical pickup which can play back both a CD and DVD. A sectional view of the same is shown in FIG. 26.

The above monolithic laser diode 14e will be explained first.

A first stack ST1 for forming a first laser diode LD1 is formed by stacking on an n-type substrate 30 composed of for example GaAs an n-type buffer layer 31 composed of for example GaAs, an n-type clad layer 32 for example composed of AlGaAs, an active layer 33, a p-type clad layer 34 composed of for example AlGaAs, and a p-type cap layer 35 composed of for example GaAs. An insulated region 41 is formed from the surface of the p-type cap layer 35 to the middle of the p-type clad layer 34 to give a stripe for forming a current narrowing structure of a gain guide type.

On the other hand, in the second laser diode LD2 region as well, the n-type buffer layer 31, n-type clad layer 32, active layer 33, p-type clad layer 34, and p-type cap layer 35 common with those of the first laser diode LD1 are stacked on the n-type substrate 30. Further, on top of this are formed an n-type buffer layer 53 composed of for example GaAs, an n-type buffer layer 48 composed of for example InGaP, an n-type clad layer 49 composed of for example AlGaInP, an active layer 50, a p-type clad layer 51 composed of for example AlGaInP, and a p-type cap layer 52 composed of for example GaAs are stacked to form a second stack ST2. An insulated region 41 is formed from the surface of the p-type cap layer 52 to the middle of the p-type clad layer 51 to give a stripe for forming a current narrowing structure of a gain guide type.

Furthermore, p-type electrodes 42 are formed connecting to the p-type cap layers (35, 52), while an n-type electrode 43 is formed connecting to the n-type substrate 30 and an n-type electrode 54 is formed connecting to the n-type buffer layer 53.

In the monolithic laser diode 14e of the above configuration, laser light L1 having a wavelength of for example the 780 nm band and laser light L2 having a wavelength of for example the 650 nm band are emitted in parallel with the substrate in substantially the same direction (substantially in parallel).

The laser diode 14e of the above configuration is a monolithic laser diode comprised of two kinds of laser diodes of different emission wavelengths mounted on a single chip suitable for constructing an optical pickup of a CD, DVD, or other different wavelength optical disk system.

The method of forming the above monolithic laser diode 14e will be explained next.

First, as shown in FIG. 27A, by using metal organic vapor phase epitaxial growth (MOVPE) or another epitaxial growth method, on an n-type substrate 30 composed of for example GaAs, an n-type buffer layer 31 composed of for example GaAs, an n-type clad layer 32 composed of for example AlGaAs, an active layer 33 (a multiplex quantum well structure having an oscillation wavelength of 780 nm), a p-type clad layer 34 composed of for example AlGaAs, and a p-type cap layer 35 composed of for example GaAs are successively stacked.

Further, by using metal organic vapor phase epitaxial growth (MOVPE) or another epitaxial growth method, on the p-type cap layer 35, an n-type buffer layer 53 composed of for example GaAs, an n-type buffer layer 48 composed of for example InGaP, an n-type clad layer 49 composed of for example AlGaInP, an active layer 50 (a multiplex quantum well structure having an oscillation wavelength of 650 nm), a p-type clad layer 51 composed of for example AlGaInP, and a p-type cap layer 52 composed of for example GaAs are successively stacked.

Next, as shown in FIG. 27B, sulfuric acid-based cap etching, phosphoric acid and hydrochloric acid-based four-elements selective etching, hydrochloric acid-based separation etching, or other wet etching (EC9) is used to remove the portions of the above stack other than that up to the p-type cap layer 35 in the first laser diode formation region and that up to the p-type cap layer 52 in the second laser diode formation region and separate the first laser diode LD1 and second laser diode LD2.

Next, as shown in FIG. 28A, the parts for forming the current injection regions are protected by a resist film and an impurity D4 is doped by ion implantation etc. to form insulated regions 41 from the surface of the p-type cap layers (35, 52) to the middle of the p-type clad layers (34, 51) to give stripes for forming current narrowing structures of the gain guide type.

Next, as shown in FIG. 28B, p-type electrodes 42 of Ti/Pt/Au etc. are formed connected to the p-type cap layers (35, 52), while an n-type electrode 43 and an n-type electrode 54 of AuGe/Ni/Au etc. are formed connected to the n-type substrate 30 and the n-type buffer layer 53.

After this, it is possible to use a pelletizing step to form the desired monolithic laser diode 14d comprised of the first laser diode LD1 and second laser diode LD2 mounted on a single chip as shown in FIG. 26.

According to the method of producing a monolithic laser diode of the above embodiment, it is possible to form a monolithic laser diode enabling emission of different wavelengths of laser light in the same way as the first embodiment. Also, it is possible to form the stack for forming the second laser diode on a flat surface (on the p-type cap layer 35) and so the epitaxial growth can be carried out more easily.

The present invention was explained above by five embodiments, however, the present invention is not limited to these embodiments.

For example, the light emitting element used in the present invention is not limited to a laser diode. A light emitting diode (LED) can be also used.

Also, the emission wavelengths of the first and second laser diodes are not limited to the 780 nm and 650 nm bands and may be wavelengths adopted in other optical disk systems. Namely, an optical disk system of combinations other than CD and DVD can be also be adopted.

Furthermore, other than the current narrowing structure of a gain guide type, other lasers of a variety of characteristics can be adopted, such as an index guide type or pulsation laser.

Also, while the cases of the same stripe structure were described for the first laser diode for CD and the second laser diode for DVD in the above embodiments, the two laser diodes can be mutually different stripe structures, e.g., the first laser diode may be an ion implantation type the same as in the first embodiment while the second laser diode may be a ridge type the same as in the second embodiment.

Furthermore, in the fourth and fifth embodiments, it is easy to use the stripe structure shown in the second and third embodiments or to use mutually different stripe structures between the first laser diode and the second laser diode as above.

In addition to the above, a variety of modifications can be made within the scope of the present invention.

Summarizing the effects of the invention, according to the semiconductor light emitting device of the present invention, since there are at least two stacks of epitaxially grown layers comprised of at least a first conductivity type clad layer, an active layer and a second conductivity type clad layer stacked on a substrate and the compositions of the active layers are mutually different, it is possible to construct a monolithic semiconductor light emitting device capable of emitting a plurality of types of light having different wavelengths from the active layers. Thus, it becomes possible to construct a semiconductor light emitting device having a plurality of semiconductor light emitting elements of different emission wavelengths enabling an optical pickup of a CD, DVD, or other different wavelength optical disk system to be reduced in the number of parts, simplified in the configuration of the optical system, easily assembled, and made more compact and lower in cost.

Also, according to the method of producing a semiconductor light emitting device of the present invention, since the compositions of the two active layers are made different between the stacks, it is possible to form a monolithic semiconductor light emitting device capable of emitting a plurality of types of light having different wavelengths from the active layers. Thus, it becomes possible to form laser diodes etc. enabling an optical pickup of a CD, DVD, or other different wavelength optical disk system to be reduced in the number of parts, simplified in the configuration of the optical system, easily assembled, and made more compact and lower in cost.

While the invention has been described with reference to specific embodiment chosen for purpose of illustration, it should be apparent that numerous modifications could be made thereto by those skilled in the art without departing from the basic concept and scope of the invention.

What is claimed is:

1. A method of producing a semiconductor light emitting device comprising on a substrate a first semiconductor light emitting element and a second semiconductor light emitting element for emitting light of different wavelengths from each other, including the steps of:

forming on the substrate by an epitaxial growth method a first stack comprised of at least a first clad layer of a first conductivity type, a first active layer, and a second clad layer of a second conductivity type;

removing the parts of said first stack other than the part at the first semiconductor light emitting element formation region;

forming on the substrate by an epitaxial growing method a second stack comprised of at least a third clad layer of the first conductivity type, a second active layer, and a fourth clad layer of the second conductivity type; and removing the parts of said second stack other than the part at the second semiconductor light emitting element formation region;

at least said first active layer and said second active layer being formed by different compositions from each other.

2. A method of producing a semiconductor light emitting device as set forth in claim 1, wherein said first active layer and second active layer are formed with mutually different composition ratios.

3. A method of producing a semiconductor light emitting device as set forth in claim 1, wherein said first active layer and second active layer are formed by mutually different composition elements.

4. A method of producing a semiconductor light emitting device as set forth in claim 1, wherein the compositions of said first clad layer of the first conductivity type, first active layer, and second clad layer of the second conductivity type and the compositions of said third clad layer of the first conductivity type, second active layer, and fourth clad layer of the second conductivity type are made different from each other.

5. A method of producing a semiconductor light emitting device having on a substrate a first semiconductor light emitting element and a second semiconductor light emitting element for emitting light of different wavelengths from each other, including the steps of:

forming on a substrate by an epitaxial growth method a first stack comprising at least a first clad layer of a first conductivity type, a first active layer, and a second clad layer of a second conductivity type;

forming on the first stack by an epitaxial growth method a second stack comprising at least a third clad layer of the first conductivity type, a second active layer, and a fourth clad layer of the second conductivity type; and removing the parts of said first stack and second stack other than the parts of said first stack and second stack at a second semiconductor light emitting element formation region and the part of said first stack at a first semiconductor light emitting element formation region;

at least said first active layer and second active layer being formed by different compositions from each other.

6. A method of producing a semiconductor light emitting device as set forth in claim 5, further including the step of making the first stack at said second semiconductor light emitting element formation region a first conductivity type prior to the step of forming said second stack; and in the step of forming the second stack, forming the second stack above said first stack made the first conductivity type from a side of said third clad layer of the first conductivity type of the second stack.

7. A method of producing a semiconductor light emitting device as set forth in claim 5, wherein said first active layer and second active layer are formed to have mutually different ratios of composition.

8. A method of producing a semiconductor light emitting device as set forth in claim 5, wherein said first active layer and second active layer are formed by mutually different composition elements.

9. A method of producing a semiconductor light emitting device as set forth in claim 5, wherein the compositions of said first clad layer of the first conductivity type, first active layer, and second clad layer of the second conductivity type and the compositions of said third clad layer of the first conductivity type, second active layer, and fourth clad layer of the second conductivity type are made different from each other.

* * * * *